(12) United States Patent
Yang et al.

(10) Patent No.: US 11,438,095 B2
(45) Date of Patent: Sep. 6, 2022

(54) APPARATUS AND METHOD FOR COMMUNICATION IN BROADCAST SYSTEM

(71) Applicant: Samsung Electronics Co., Ltd., Suwon-si (KR)

(72) Inventors: Hyunkoo Yang, Suwon-si (KR); Sunghee Hwang, Suwon-si (KR); Dongyeon Kim, Suwon-si (KR); Jaehyeon Bae, Suwon-si (KR); Youngwan So, Suwon-si (KR); Eric Yip, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 52 days.

(21) Appl. No.: 16/963,098

(22) PCT Filed: Jan. 21, 2019

(86) PCT No.: PCT/KR2019/000831
§ 371 (c)(1),
(2) Date: Jul. 17, 2020

(87) PCT Pub. No.: WO2019/143208
PCT Pub. Date: Jul. 25, 2019

(65) Prior Publication Data
US 2020/0351013 A1    Nov. 5, 2020

(30) Foreign Application Priority Data

Jan. 19, 2018  (KR) .................. 10-2018-0007401
Jan. 24, 2018  (KR) .................. 10-2018-0008962

(51) Int. Cl.
*H04L 1/00*     (2006.01)
*H04L 47/34*    (2022.01)

(52) U.S. Cl.
CPC ............ *H04L 1/0041* (2013.01); *H04L 47/34* (2013.01)

(58) Field of Classification Search
CPC ..... H04L 1/0041; H04L 1/0045; H04L 47/34; H03M 13/2707; H03M 13/6356; H03M 13/2906
See application file for complete search history.

(56) References Cited

U.S. PATENT DOCUMENTS 7,031,904 B1 *   4/2006  Wilson ................ H04L 67/1097
                                                370/338
9,372,870 B1 *   6/2016  Levy ................... G06F 11/1004
(Continued)

FOREIGN PATENT DOCUMENTS

KR   10-2012-0137198 A    12/2012
KR   10-2015-0050133 A    5/2015
(Continued)

OTHER PUBLICATIONS

Korean Notice of Allowance dated Jun. 2, 2022, issued in Korean Patent Application No. 10-2018-0008962.

*Primary Examiner* — Guy J Lamarre
(74) *Attorney, Agent, or Firm* — Jefferson IP Law, LLP

(57) ABSTRACT

The present disclosure relates to a communication apparatus and method for supporting a forward error correction scheme in a communication system. To this end, by means of a generation mode among a plurality of generation modes (ssbg_mode #0, #1, #2), a source symbol block having a plurality of source symbols is generated by using a source packet block having a plurality of source packets, and a repair symbol block for the generated source symbol block is generated by means of a forward error correction (FEC) scheme among a plurality of FEC schemes (FEC payload ID mode 0, FEC payload ID mode 1). A first FEC scheme (FEC payload ID mode 1) is applied to generate the repair symbol (Continued)

block, and in response to an occurrence of a discontinuity in packet sequence numbers, a repair packet may be generated to include length repair data and a repair FEC payload identifier (ID).

12 Claims, 17 Drawing Sheets

(56) References Cited

U.S. PATENT DOCUMENTS

| | | | | |
|---|---|---|---|---|
| 10,956,082 B1* | 3/2021 | Chen | ..................... | G06F 3/0685 |
| 2003/0156634 A1* | 8/2003 | Zurbes | ................... | H04L 1/203 |
| | | | | 375/227 |
| 2007/0110046 A1* | 5/2007 | Farrell | ................... | H04L 69/16 |
| | | | | 370/389 |
| 2011/0045901 A1* | 2/2011 | Bond | ..................... | G07F 17/32 |
| | | | | 463/29 |
| 2012/0317461 A1 | 12/2012 | Hwang et al. | | |
| 2013/0007541 A1* | 1/2013 | Carman | ............... | G06F 11/106 |
| | | | | 714/710 |
| 2013/0007542 A1* | 1/2013 | Carman | ............... | G06F 11/106 |
| | | | | 714/710 |
| 2013/0013982 A1* | 1/2013 | Hwang | ................ | H04L 1/0065 |
| | | | | 714/776 |
| 2013/0080858 A1* | 3/2013 | Lee | ..................... | G11C 16/349 |
| | | | | 714/E11.054 |
| 2014/0304570 A1* | 10/2014 | Baek | .................... | H04L 1/1812 |
| | | | | 714/752 |
| 2015/0262677 A1* | 9/2015 | Lin | ..................... | G11C 11/5642 |
| | | | | 365/185.12 |
| 2015/0332778 A1* | 11/2015 | Kim | ................... | G11C 16/3422 |
| | | | | 365/185.18 |
| 2016/0044532 A1 | 2/2016 | Champel | | |
| 2016/0217868 A1* | 7/2016 | Dutta | ................ | G11C 16/3418 |
| 2016/0277146 A1 | 9/2016 | Hwang | | |
| 2016/0337076 A1 | 11/2016 | Hwang | | |
| 2016/0352465 A1* | 12/2016 | Hwang | ................ | H04L 1/0083 |
| 2017/0104685 A1 | 4/2017 | Hwang et al. | | |
| 2017/0149526 A1 | 5/2017 | Yang et al. | | |
| 2017/0162259 A1* | 6/2017 | Kim | ................... | G11C 16/0483 |
| 2017/0366299 A1* | 12/2017 | Li | ........................... | H04L 5/00 |
| 2018/0261296 A1* | 9/2018 | Choi | ..................... | G11C 29/42 |
| 2019/0080752 A1* | 3/2019 | Hwang | ................ | G11C 16/26 |
| 2019/0198122 A1* | 6/2019 | Yeh | ...................... | G11C 29/52 |
| 2020/0211656 A1* | 7/2020 | Oh | ..................... | G11C 11/5642 |

FOREIGN PATENT DOCUMENTS

| | | |
|---|---|---|
| KR | 10-2015-0112661 A | 10/2015 |
| KR | 10-2016-0108830 A | 9/2016 |
| KR | 10-2016-0138382 A | 12/2016 |
| WO | 2017/140261 A1 | 8/2017 |

* cited by examiner

|  | | | | | | | |
|---|---|---|---|---|---|---|---|
| B[0,0] | B[0,8] | B[1,0] | B[2,0] | B[2,8] | B[3,4] | B[3,12] | |
| B[0,1] | B[0,9] | B[1,1] | B[2,1] | B[2,9] | B[3,5] | B[3,13] | |
| B[0,2] | B[0,10] | B[1,2] | B[2,2] | 0 | B[3,6] | 0 | |
| B[0,3] | B[0,11] | B[1,3] | B[2,3] | 0 | B[3,7] | 0 | |
| B[0,4] | B[0,12] | B[1,4] | B[2,4] | B[3,0] | B[3,8] | 0 | |
| B[0,5] | 0 | B[1,5] | B[2,5] | B[3,1] | B[3,9] | 0 | |
| B[0,6] | 0 | 0 | B[2,6] | B[3,2] | B[3,10] | 0 | |
| B[0,7] | 0 | 0 | B[2,7] | B[3,3] | B[3,11] | 0 | |

APPARATUS AND METHOD FOR COMMUNICATION IN BROADCAST SYSTEM

CROSS-REFERENCE TO RELATED APPLICATION(S)

This application is a National Phase Entry of PCT International Application No. PCT/KR2019/000831, which was filed on Jan. 21, 2019 and claims priority to Korean Patent Application No. 10-2018-0007401, which was filed on Jan. 19, 2018 and Korean Patent Application No. 10-2018-0008962 filed on Jan. 24, 2018 in the Indian Intellectual Property Office, the contents of which are incorporated herein by reference.

BACKGROUND

1. Field

The disclosure relates to a communication device and method supporting a forward error correction scheme in a communication system.

2. Description of the Related Art

Generally, broadcast systems use error correction schemes that support receiving devices to be able to repair missing data over the network. The forward error correction (FEC) scheme is a representative error correction scheme that supports the receiving device to repair missing data. The FEC scheme may be divided considering applied layers. The application layer forward error correction (AL-FEC) scheme is an FEC scheme in which FEC processing occurs in the application layer.

In the FEC scheme, e.g., the transmitting device may provide redundancy information for use to repair missing information to the receiving device. Here, the transmitting device and receiving device may generate the redundancy information using an agreed-on algorithm. The algorithm may generate the redundancy information using source information as an input.

SUMMARY

In the FEC scheme-applied broadcast system, the transmitting device may obtain repair symbols by performing FEC encoding on multiple source symbols constituting the source symbol block. This should be preceded by changing multiple source packets constituting the source packet block into multiple symbols constituting the source symbol block. The source packet may be the MMT packet, e.g., when the moving picture experts group (MPEG) media transport (hereinafter, "MMT") protocol is used.

The source symbols may have the same length whereas the source packets are variable in length. If the length of one source packet is larger than the length of one source symbol, the one source packet may be split into a plurality of source symbols. Further, one source symbol may maintain the same length using padding data.

Thus, for the receiving device to repair the missing source packet using the decoded source symbol block would need specifying the source symbols constituting the missing source packet and removing the padding data.

According to an embodiment of the disclosure, there is provided a method and device of transmitting/receiving packets in a broadcast system.

Further, according to another embodiment of the disclosure, there is provided a packet transmitting/receiving method and device that increase data restoration efficiency in a broadcast system.

Further, according to still another embodiment of the disclosure, there is provided a packet transmitting/receiving method and device that may obtain efficient transmission reliability in a broadcast system.

Further, according to yet another embodiment of the disclosure, there is provided a transmitting/receiving method and device, in which the receiving device may specify the source symbols corresponding to the source packet in the source block regardless of whether to receive the source packet in a broadcast system.

Further, according to yet still another embodiment of the disclosure, there is provided a transmitting/receiving method and device that may locate the start point of the missing source packet in the source symbols of the repaired source symbol block in a broadcast system.

Further, according to yet still another embodiment of the disclosure, there is provided a transmitting/receiving method and device that may remove padding data from the source symbols of the source symbol block fully or partially repaired in a broadcast system.

Further, according to yet still another embodiment of the disclosure, there is provided a transmitting/receiving method and device that may repair all source packets with the source symbols of the source symbol block fully or partially repaired in a broadcast system.

According to an embodiment of the disclosure, a method of generating a transmission packet by a transmitting device in a broadcast system comprises generating a source symbol block having plurality of source symbols using a source packet block having a plurality of source packets by one generation mode of a plurality of generation modes (ssbg_mode #0, #1, #2), generating a repair symbol block for the generated source symbol block by one forward error correction (FEC) scheme of a plurality of forward FEC schemes (FEC payload ID mode 0, FEC payload ID mode 1), generating a source packet by the plurality of source packets, and generating a repair packet by the generated repair symbol block.

Here, generating the repair packet includes generating the repair packet in which length repair data and a repair FEC payload identifier (ID) are included in response to an occurrence of a discontinuity of a packet sequence number, and a first FEC scheme (FEC payload ID mode 1) being applied to generate the repair symbol block.

According to an embodiment of the disclosure, a transmitting device of a broadcast system comprises a transmitter configured to transmit a transmission packet to an external device for a broadcast service and a processor connected with the transmitter and configured to generate the transmission packet for the broadcast service.

Here, the at least one processor is configured to generate a source symbol block having plurality of source symbols using a source packet block having a plurality of source packets by one generation mode of a plurality of generation modes (ssbg_mode #0, #1, #2), generate a repair symbol block for the generated source symbol block by one forward error correction (FEC) scheme of a plurality of forward FEC schemes (FEC payload ID mode 0, FEC payload ID mode 1), generate a source packet by the plurality of source packets, and generate the repair packet in which length repair data and a repair FEC payload identifier (ID) are included in response to an occurrence of a discontinuity of a packet sequence number, and a first FEC scheme (FEC payload ID mode 1) being applied to generate the repair symbol block.

According to an embodiment of the disclosure, a method of restoring a transmission packet by a receiving device in a broadcast system comprises receiving a source packet including a plurality of source packets and a repair packet including a repair symbol block, identifying whether a packet sequence number is disconnected and a fist FEC scheme (FEC payload ID mode 1) among a plurality of FEC schemes (FEC payload ID mode 0, FEC payload ID mode 1) is applied, to generate the repair symbol block based on a plurality of flags included in a repair forward error correction (FEC) payload identifier (ID) of the repair packet, decoding length repair data of the repair packet in response to an occurrence of the packet sequence number and the first FEC scheme (FEC payload ID mode 1) being applied, and restoring a missing transmission packet using the decoded length repair data.

Here, the plurality of flags include a first flag (D: discontinuity flag) indicating that the discontinuity of the packet sequence number has occurred, a second flag (I) indicating whether the length repair data is included in the repair packet, a third flag (F: FEC_parameter_flag) indicating whether the same FEC code is used to generate the repair symbol block and the length repair data, and a fourth flag (N: num_LRS_flag) indicating whether the number of repair symbols included in the length repair data is the same as the number of repair symbols included in the repair packet, and wherein the repair FEC payload identifier (ID) further includes information about a length configured considering the first to fourth flags.

According to an embodiment of the disclosure, a receiving device of a broadcast system comprises a receiver configured to receive a source packet including a plurality of source packets and a repair packet including a repair symbol block and a processor connected with the receiver and configured to repair a source packet received through the receiver.

Here, the at least one processor is configured to identify whether a packet sequence number is disconnected and a fist FEC scheme (FEC payload ID mode 1) among a plurality of FEC schemes (FEC payload ID mode 0, FEC payload ID mode 1) is applied, to generate the repair symbol block based on a plurality of flags included in a repair forward error correction (FEC) payload identifier (ID) of the repair packet, decode length repair data of the repair packet in response to an occurrence of the packet sequence number and the first FEC scheme (FEC payload ID mode 1) being applied, and repair a missing transmission packet using the decoded length repair data.

Here, the plurality of flags include a first flag (D: discontinuity flag) indicating that the discontinuity of the packet sequence number has occurred, a second flag (I) indicating whether the length repair data is included in the repair packet, a third flag (F: FEC_parameter_flag) indicating whether the same FEC code is used to generate the repair symbol block and the length repair data, and a fourth flag (N: num_LRS_flag) indicating whether the number of repair symbols included in the length repair data is the same as the number of repair symbols included in the repair packet, and wherein Here, the repair FEC payload identifier (ID) further includes information about a length configured considering the first to fourth flags.

BRIEF DESCRIPTION OF DRAWINGS

Particular preferred embodiments of the present disclosure and the foregoing and other aspects, features, and advantages will be apparent from the following detailed description taken in conjunction with the accompanying drawings, wherein.

It should be noted that the same or similar reference denotations may be used to refer to the same or similar elements, features, or structures throughout the drawings.

DETAILED DESCRIPTION

Figure 1:
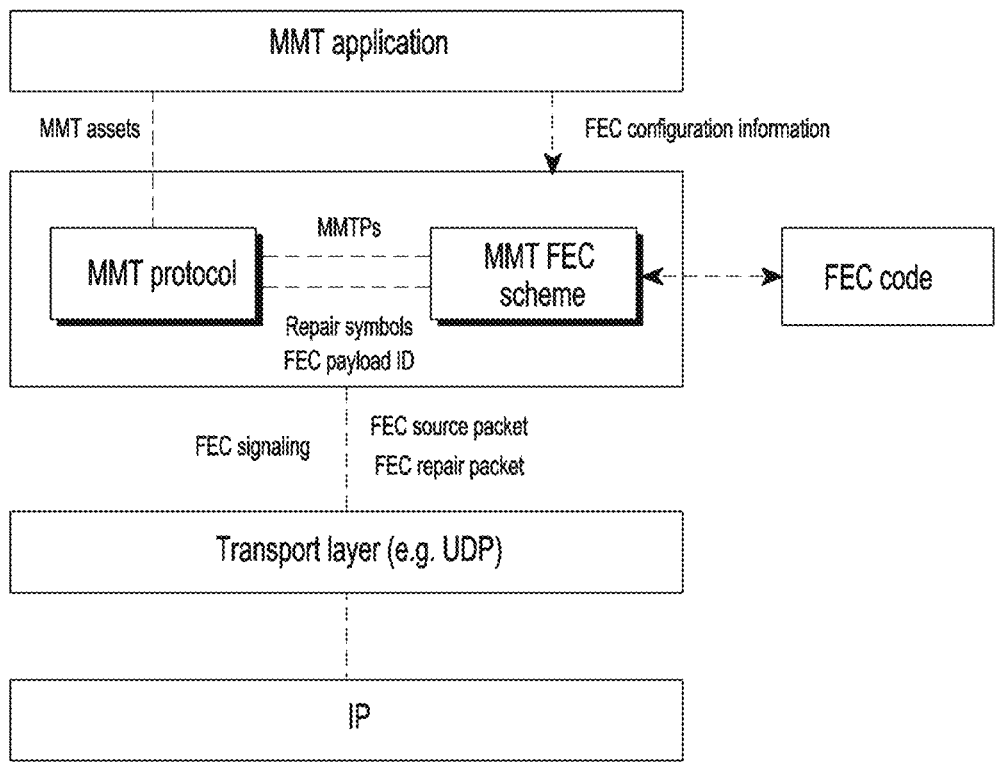
FIG. 1 is a view illustrating a hierarchical structure of an electronic device supporting a broadcast service to which various embodiments proposed in the disclosure are to be applied.

Hereinafter, embodiments of the present disclosure are described with reference to the accompanying drawings. However, it should be appreciated that the present disclosure is not limited to the embodiments, and all changes and/or equivalents or replacements thereto also belong to the scope of the present disclosure. The same or similar reference denotations may be used to refer to the same or similar elements throughout the specification and the drawings.

As used herein, the terms "have," "may have," "include," or "may include" a feature (e.g., a number, function, operation, or a component such as a part) indicate the existence of the feature and do not exclude the existence of other features.

As used herein, the terms "A or B," "at least one of A and/or B," or "one or more of A and/or B" may include all possible combinations of A and B. For example, "A or B," "at least one of A and B," "at least one of A or B" may indicate all of (1) including at least one A, (2) including at least one B, or (3) including at least one A and at least one B.

As used herein, the terms "first" and "second" may modify various components regardless of importance and do not limit the components. These terms are only used to distinguish one component from another. For example, a first user device and a second user device may indicate different user devices from each other regardless of the order or importance of the devices. For example, a first component may be denoted a second component, and vice versa without departing from the scope of the present disclosure.

It will be understood that when an element (e.g., a first element) is referred to as being (operatively or communicatively) "coupled with/to," or "connected with/to" another element (e.g., a second element), it can be coupled or connected with/to the other element directly or via a third element. In contrast, it will be understood that when an element (e.g., a first element) is referred to as being "directly coupled with/to" or "directly connected with/to" another element (e.g., a second element), no other element (e.g., a third element) intervenes between the element and the other element.

As used herein, the terms "configured (or set) to" may be interchangeably used with the terms "suitable for," "having the capacity to," "designed to," "adapted to," "made to," or "capable of" depending on circumstances. The term "configured (or set) to" does not essentially mean "specifically designed in hardware to" Rather, the term "configured to" may mean that a device can perform an operation together with another device or parts. For example, the term "processor configured (or set) to perform A, B, and C" may mean a generic-purpose processor (e.g., a CPU or application processor) that may perform the operations by executing one or more software programs stored in a memory device or a dedicated processor (e.g., an embedded processor) for performing the operations.

The terms as used herein are provided merely to describe some embodiments thereof, but not to limit the scope of other embodiments of the present disclosure. It is to be understood that the singular forms "a," "an," and "the" include plural references unless the context clearly dictates otherwise. All terms including technical and scientific terms used herein have the same meaning as commonly understood by one of ordinary skill in the art to which the embodiments of the present disclosure belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some cases, the terms defined herein may be interpreted to exclude embodiments of the present disclosure.

Hereinafter, various embodiments of the present invention are described in detail with reference to the accompanying drawings.

FIG. 1 is a view illustrating a hierarchical structure of an electronic device supporting a broadcast service to which various embodiments proposed in the disclosure are to be applied.

Referring to FIG. 1, an electronic device may have a structure in which, e.g., the AL-FEC applies to the MMT. That is, the electronic device may have a layered structure including an MMT application layer, a protocol layer, a transport layer, and an internet protocol (IP) layer. The electronic device may be a transmitting device or receiving device supporting, e.g., broadcast services.

The transmitting device determines assets needing protection in the MMT package and the number of FEC source flows to protect the assets. One FEC source flow may protect one or more assets. The FEC source flow may be configured of MMTP packets transferring one or more assets. The FEC source flow and its configuration information may be transferred in an FEC scheme.

The FEC scheme may generate repair symbols constituting one or more FEC repair flows using one or more FEC codes. The repair symbols may be transferred, along with the FEC payload ID, to a receiving device based on the MMT protocol. That is, the transmitting device may transfer FEC source packets and FEC repair packets to the receiving device using the MMT protocol.

The MMT protocol of the receiving device may transfer the FEC source flow and one or more FEC repair flows related to the FEC source flow in an FEC scheme. An FEC method may attempt to repair missing MMTP packets and transfer the repaired MMTP packets via the MMT protocol.

The FEC scheme proposes a scheme that splits the FEC source flow into source packet blocks and generates source symbol blocks with the source packet blocks. The generated source symbol blocks are FEC-encoded by the FEC code. Here, FEC encoding means generating the repair symbol block constituted of repair symbols using the source symbol block constituted of source symbols. An FEC encoding algorithm may be used to create the repair symbol block in the source symbol block. As an example, the FEC encoding algorithm specified in ISO/IEC 23008-10 may be used.

The FEC scheme may be operated in one mode of two different modes, i.e., FEC payload ID mode 0 and FEC payload ID mode 1. FEC payload ID mode 0 adds the source FEC payload ID to the MMTP packet, and FEC payload ID mode 1 makes no change to the existing MMTP packet.

The FEC scheme may configure packets including layered or non-layered media data with multiple levels using the FEC encoding structure. This enables applying a necessary degree of protection level to each asset constituting one FEC source flow. The FEC source flow may be the MMTP sub flow transferring a signaling message. The FEC encoding structure may include, e.g., a two-stage FEC encoding structure and a layer-aware FEC (LA-FEC) encoding structure.

Figure 2:
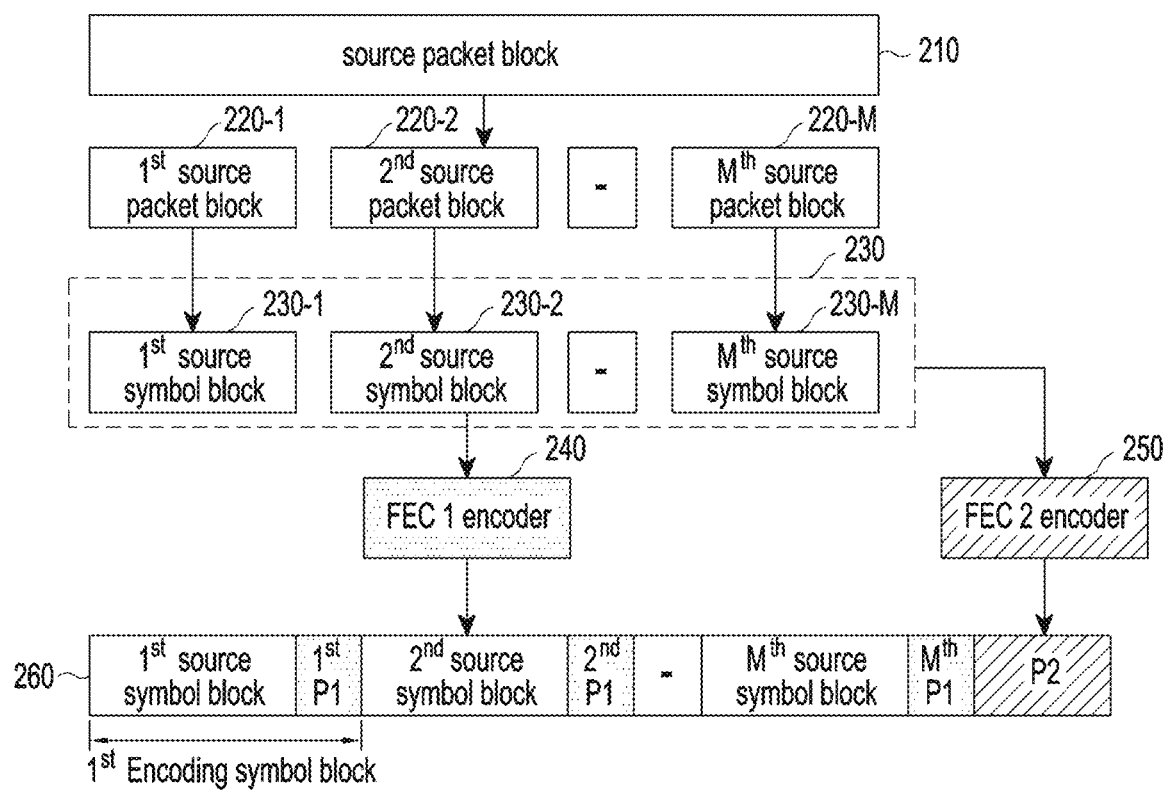
FIG. 2 is a view illustrating a two-stage FEC encoding structure to which various embodiments proposed in the disclosure are to be applied.

FIG. 2 is a view illustrating a two-stage FEC encoding structure to which various embodiments proposed in the disclosure are to be applied.

Referring to FIG. 2, one source packet block 210 may be split into M (>1) source packet blocks 220-1, 220-2, ..., 220-M. The split-into source packet blocks 220-1, 220-2, ..., 220-M may be converted into M source symbol blocks 230-1, 230-2, ..., 230-M by one of a plurality of source symbol block generation schemes (ssbg modes or source symbol block generation modes). The M source symbol blocks 230-1, 230-2, ..., 230-M each are encoded using the first FEC code 240.

A single source symbol block 230 may be generated by connecting the M source symbol blocks 230-1, 230-2, ..., 230-M, and the generated single source symbol block 230 may be encoded using a second FEC code 250.

By encoding each of the M source symbol blocks 230-1, 230-2, ..., 230-M using the first FEC code 240, M repair symbol blocks ($1^{st}$_P1, $2^{nd}$_P1 ... $M^{th}$_P1) are generated. One repair symbol block P2 is generated by encoding the single source symbol block 230 using the second FEC code 250.

The LA-FEC encoding structure is an FEC encoding structure specified for media data (e.g., SVC, MVC, etc.). The LA-FEC encoding structure uses inter-media layer association and each media layer has associated FEC repair flows. Here, the FEC repair flow protects the data of the associated media layers and all media layers (which are hereinafter referred to as complementary layers) on which the associated media layers rely.

In the LA-FEC encoding structure, the source packets including the data of each media layer are grouped into different source symbol blocks per layer. The source symbol blocks used to generate the repair symbols constituting one FEC repair flow are in the form of a combination of a source symbol block constituted of data of the media layer associated with the FEC repair flow and source symbol blocks constituted of the complementary layer data of the associated media layer. The combination of the source symbol blocks constituted of the data of different layers follows the hierarchical structure of media. That is, each source symbol block may follow the source symbol block constituted of the complementary layer data of the media data contained in the source symbol block.

The source symbol block and repair symbol block generated as described above, may form one encoding symbol block, and the repair symbol block P2 generated from the single source symbol block 230 may be combined with the one encoding symbol block.

Figure 3:
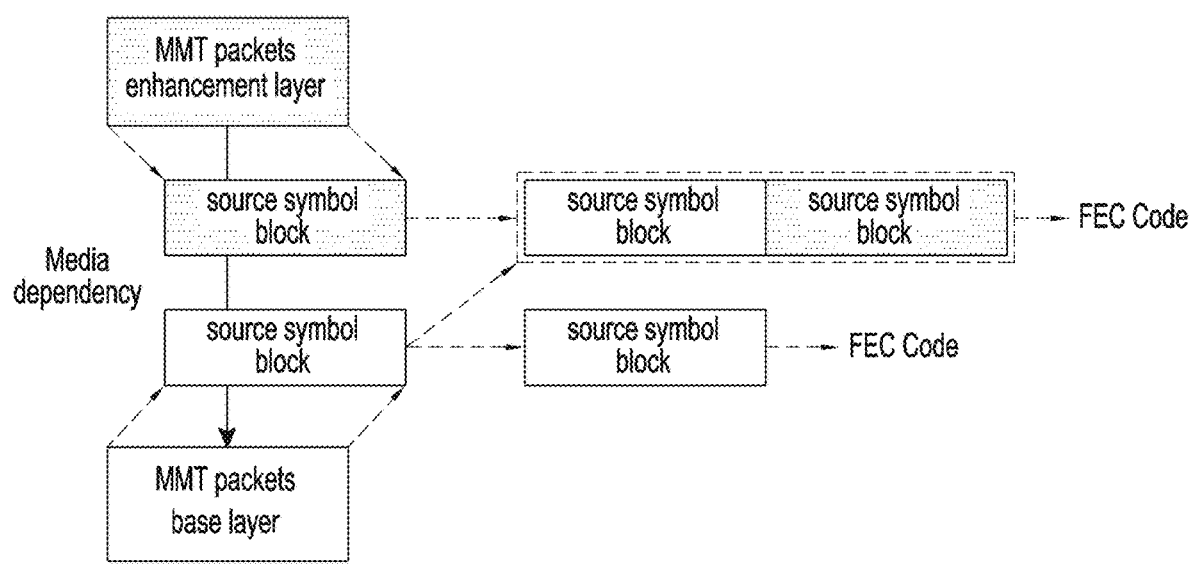
FIG. 3 is a view illustrating a scheme of generating a source symbol block in an LA-FEC encoding structure having two layers to which various embodiments proposed in the disclosure are to be applied.

FIG. 3 is a view illustrating a scheme of generating a source symbol block in an LA-FEC encoding structure having two layers to which various embodiments proposed in the disclosure are to be applied.

In FIG. 3, enhancement layer (Enh. Layer) refers to a layer relying on the base layer in the hierarchical media stream.

Figure 4:
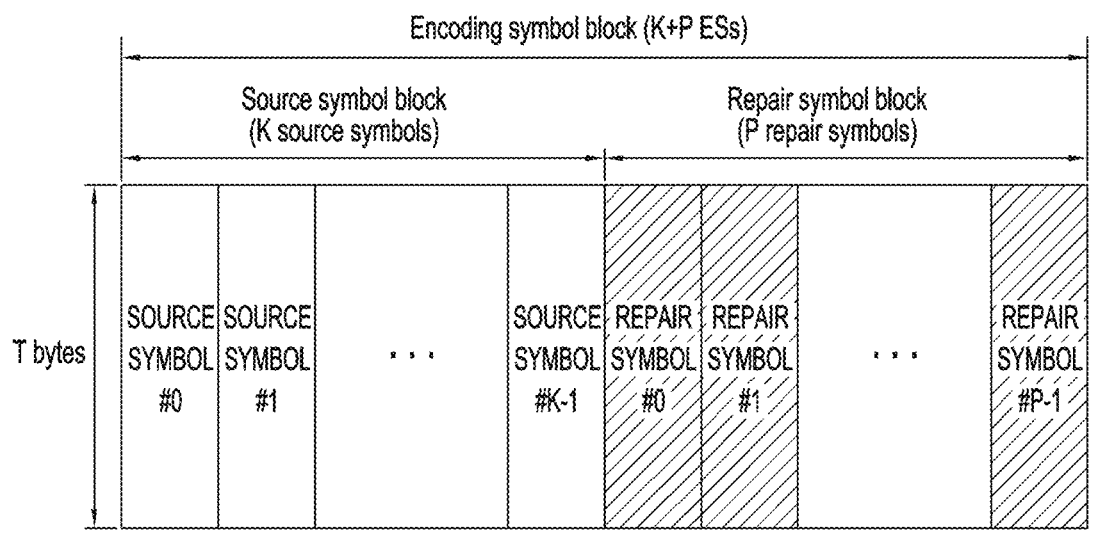
FIG. 4 is a view illustrating an example encoding symbol block in a broadcast system according to an embodiment of the disclosure.

FIG. 4 is a view illustrating an example encoding symbol block in a broadcast system according to an embodiment of the disclosure.

Referring to FIG. 4, the encoding symbol block is configured of the source symbol block and the repair symbol block generated by the source symbol block. The source symbol block may be configured according to the scheme agreed on by the transmitting device and the receiving device.

The broadcast system may define, e.g., one or more source symbol block generation schemes and, as necessary, select one of them and generate the source symbol block. Hereinafter, source symbol block generation scheme is denoted an SSBG mode. The SSBG mode selected by the transmitting device may be transferred to the receiving device via a signaling message.

According to an embodiment, the encoding symbol block consists of a source symbol block including K source symbols and a repair symbol block including repair symbols. It should be noted that the source symbols and repair symbols belonging to the encoding symbol block have the same length, T bytes.

In the broadcast system supporting multimedia services, the FEC source flow is split into source packet blocks and protected. The source packets belonging to the source packet block may have a constant or variable length. The source packet block may be converted into the source symbol block according to the SSBG mode, for FEC encoding.

The broadcast system supporting multimedia services may use three kinds of SSBBG modes, named, e.g., ssbg_mode0, ssbg_mode1, and ssbg_mode2. ssbg_mode0 may be used only when all of the MMT packets constituting one source packet block have the same length. ssbg_mode1 and ssbg_mode2 may be used even when the MMT packets constituting one source packet block have different lengths.

Embodiments where FEC payload ID mode 0 is applied are described below with reference to FIGS. 5 to 12, and embodiments where FEC payload ID mode 1 is applied are described with reference to FIGS. 13 to 17.

Figure 5:
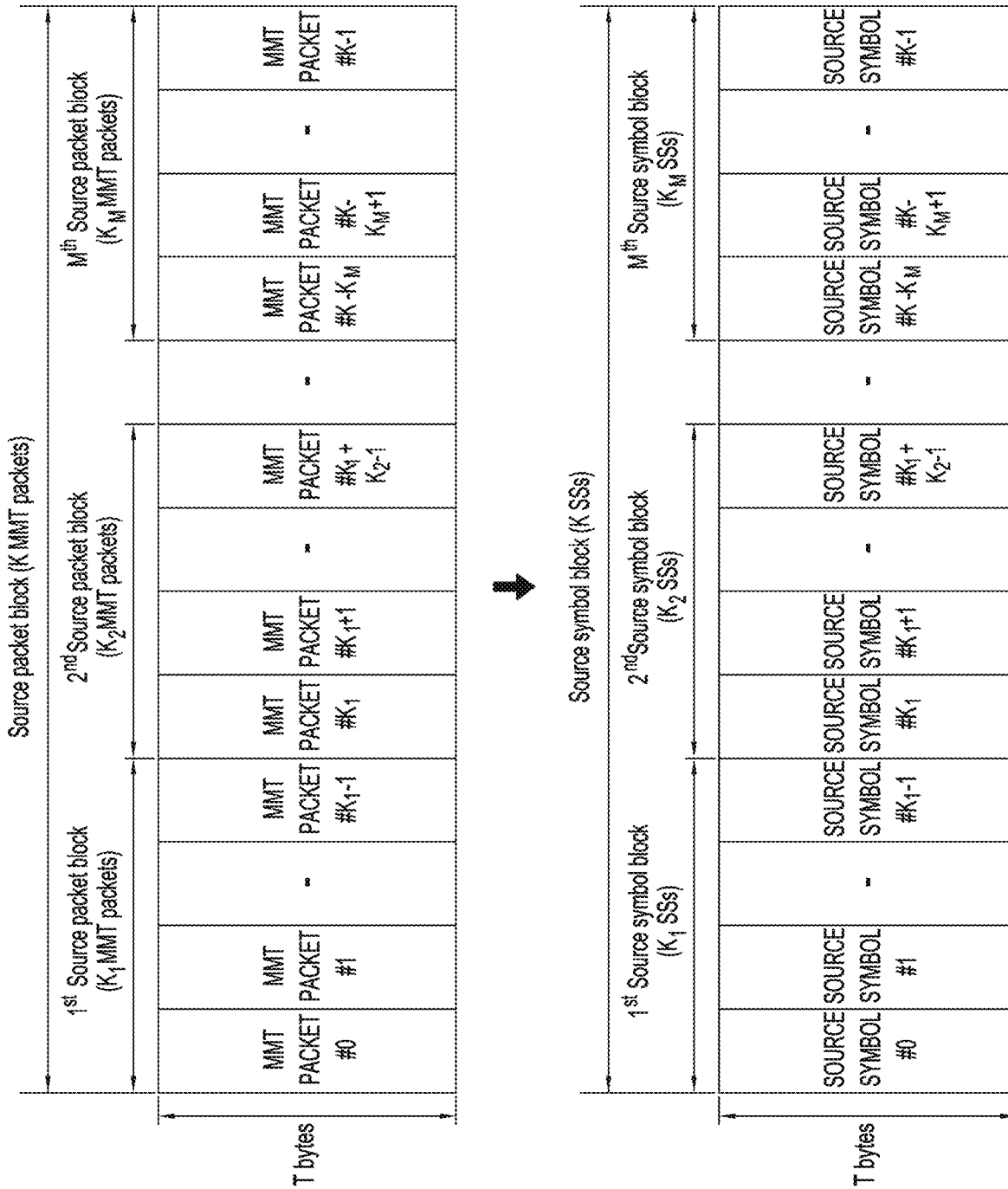
FIG. 5 is a view illustrating a source symbol block generated using ssbg_mode 0 in a broadcast system according to an embodiment of the disclosure.

FIG. 5 is a view illustrating an example source symbol block generated using ssbg_mode 0 in a broadcast system according to an embodiment of the disclosure.

Referring to FIG. 5, when ssbg_mode 0 is used, all the MMT packets constituting one or more (M) source packet blocks may have the same length. In this case, the number (K) of the source symbols constituting the source symbol block is identical to the number (K) of the source packets, i.e., MMT packets, constituting the source packet block. For example, this denotes that the ith MMT packet of the source packet block is the same as the ith symbol of the source symbol block (i=0, 1, ..., K−1). When the two-stage FEC encoding structure or LA-FEC encoding structure is applied (M>1), the ith source symbol block is generated from the ith source packet block (i=0, 1, ... M−1).

Figure 6:
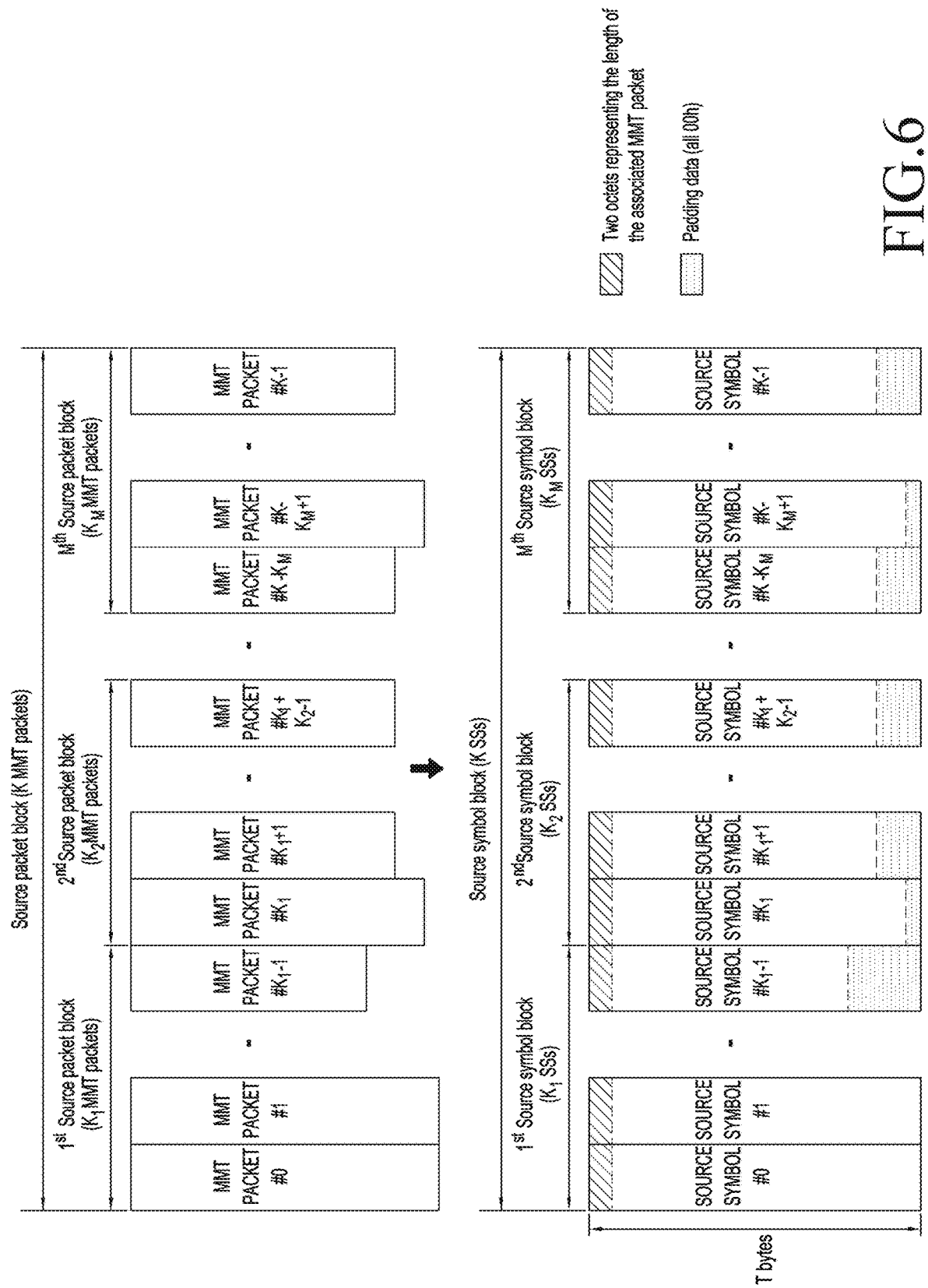
FIG. 6 is a view illustrating an example source symbol block generated using ssbg_mode 1 in a broadcast system according to an embodiment of the disclosure.

FIG. 6 is a view illustrating an example source symbol block generated using ssbg_mode 1 in a broadcast system according to an embodiment of the disclosure.

Referring to FIG. 6, when ssbg_mode 1 is used, each of the source symbols constituting the source symbol block may, as necessary, have a padding byte, so that its length becomes identical to the length of the MMT packet associated with the source symbol. Except for this, the source symbol block may be generated in the same manner as ssbg_mode 0. That is, the number (K) of the MMT packets included in one source packet block is identical to the number (K) of the source symbols included in one source symbol block associated with the source packet block.

According to ssbg_mode 1, the ith source symbol of the source symbol block may start with two octets arranged in order of network byte (higher octet first) indicating the length of the ith MMT packet of the source packet block associated with the ith source symbol of the source symbol block. Then, the octets of MMT packet # i are arranged, and the rest is filled with 0 octets.

When the two-stage and LA_FEC encoding structure (M>1) is used, the ith source symbol block may be generated from the ith source packet block (i=0, 1, . . . M−1), and the source symbols belonging to each source symbol block may include the padding byte (00h) at the end.

Figure 7:
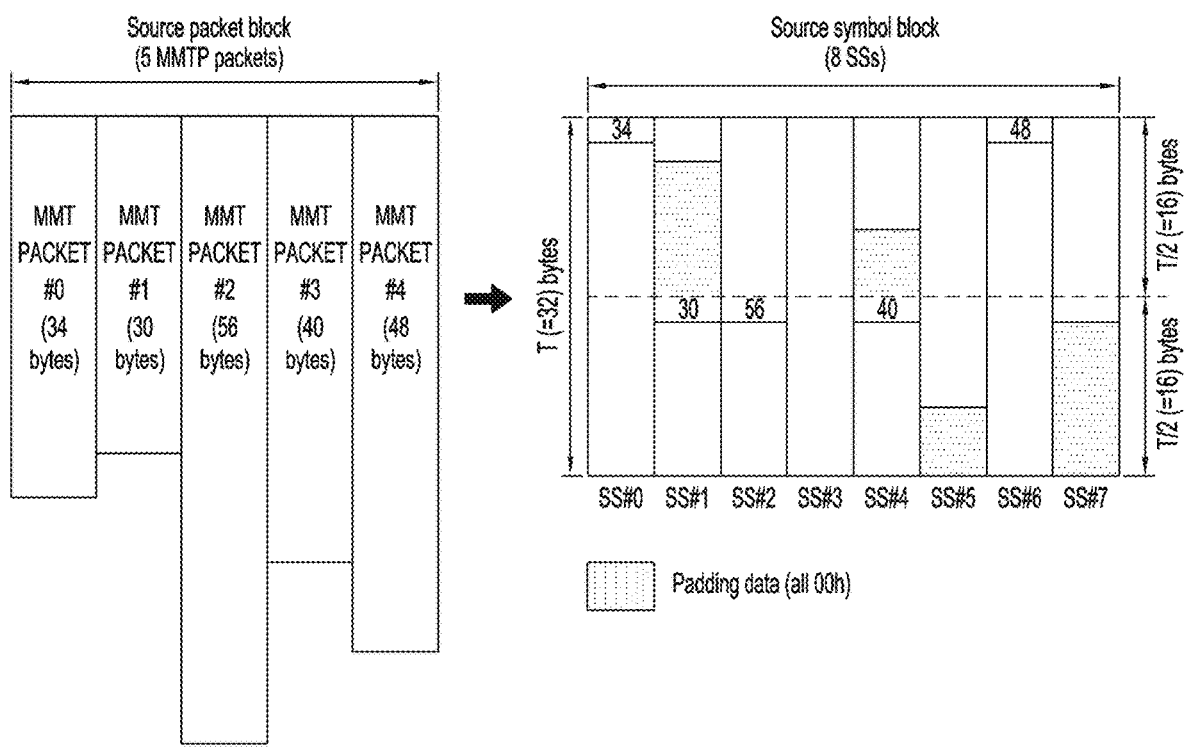
FIG. 7 is a view illustrating an example source symbol block generated using ssbg_mode 2 in a broadcast system according to an embodiment of the disclosure.

FIG. 7 is a view illustrating an example source symbol block generated using ssbg_mode 2 in a broadcast system according to an embodiment of the disclosure.

Referring to FIG. 7, the five MMT packets constituting one source packet block are individually 34, 30, 56, 40, and 48, and the five MMT packets may be arranged in the eight source symbols constituting one source symbol block. At this time, the size T of source symbol is 32, and each source symbol may consist of two symbol elements (T'=T/2=16 bytes).

According to an embodiment, in ssbg_mode 2, one source symbol block may be generated from the source packet block including Ksp source packets. The one source symbol block may include Kss source symbols. All source symbols each may include N symbol elements. This means that one source symbol block consists of N*Kss symbol elements.

MMT packet #0 of the source packet block may be positioned at first s0 symbol elements of the associated source symbol block.

More specifically, the first two bytes of the first symbol element among the s0 symbol elements may start with the two octets in order of network byte indicating the length of MMTP packet #0. The subsequent may be filled with octets of MMTP packet #0, and the rest with zero octets. The first MMT packet of the source packet block, along with the 0th MMT packet, may be arranged at the next s1 symbol elements in the source symbol block. After filling is done up to # Ksp−1 in the same manner, if Kss*T−sum {si*T/N, i=0 . . . Ksp−1} is not 0, zero octets are arranged in the remaining symbol elements of the source symbol block.

In the two-stage and LA-FEC encoding structure, a single source symbol block for the second FEC code is generated by connecting all the source symbol blocks generated from M source packet blocks.

Definitions of specific values in SSBG mode
Ksp: number of MMT packets (source packets) in source packet block
Kss: number of source symbols in source symbol block
Ri: octet of ith MMT packet to be added to source symbol block
Si: length of Ri represented in unit of octet
Li: Si value denoted with two octets in order of network byte
T: source symbol size represented in bytes
N: number of symbol elements constituting one source symbol
T': size (T'=T/N) of symbol element represented in bytes
si: smallest integer meeting si*T/N=siT'>=(Si+2)
Pi: si*T'−(Si+2) zero octets
P: Kss*T−sum {si*T', i=0 . . . Ksp−1} zero octets At this time, the source symbol block may be configured by sequentially connecting Li, Ri, and Pi(i=0 . . . Ksp−1) and P and then splitting the result into source symbols with a size of T.

MMT packet, which is one transmission packet in the broadcast system supporting multimedia services, may be divided into FEC source packet and FEC repair packet. The FEC source packet has a format for transmitting the source packet, and the FEC repair packet has a format for transmitting the repair symbol.

Figure 8:
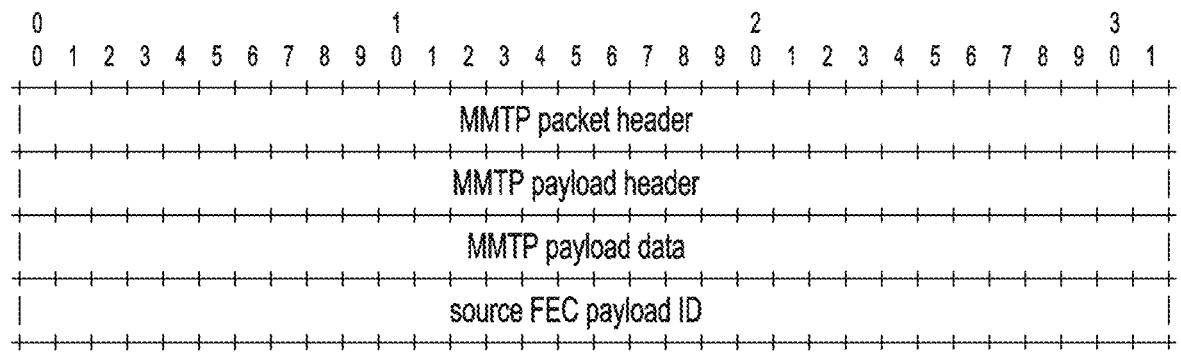
FIG. 8 is a view illustrating an example FEC source packet format in a broadcast system according to an embodiment of the disclosure.

FIG. 8 is a view illustrating an example FEC source packet format in a broadcast system according to an embodiment of the disclosure.

Referring to FIG. 8, an FEC source packet may have a format in which a source FEC payload ID is added to an MMTP packet including an MMTP packet header, an MMTP payload header, and an MMTP payload. The source FEC payload ID may provide information for identifying the source symbol or symbol element carried by the FEC source packet.

Figure 9:
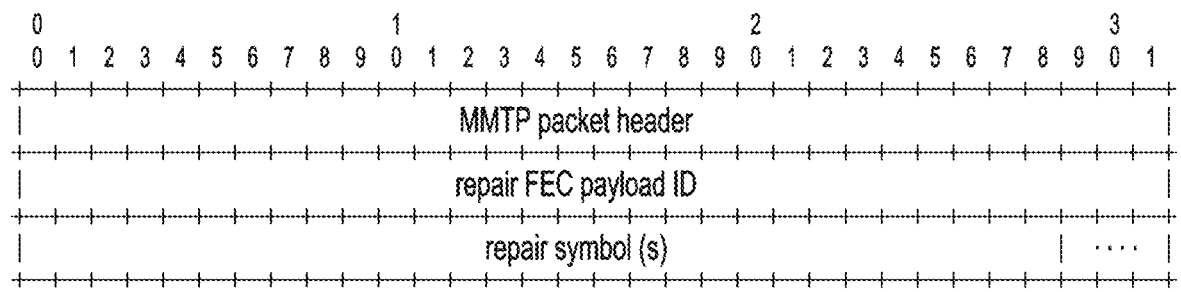
FIG. 9 is a view illustrating an example FEC repair packet format in a broadcast system according to an embodiment of the disclosure.

FIG. 9 is a view illustrating an example FEC repair packet format in a broadcast system according to an embodiment of the disclosure.

Referring to FIG. 9, an FEC repair packet may have a format of including an MMTP packet header, a repair FEC payload ID, and one or more repair symbols. The repair FEC payload ID may provide information for identifying the repair symbol(s) and related source packet block included in the FEC repair packet.

When ssbg_mode 0 or ssbg_mode 1 is used, the FEC repair packet should include only one repair symbol. When ssbg_mode 2 is used, the FEC repair packet may include one or more repair symbols.

Among the FEC repair packets belonging to the FEC repair packet block, the one or more other FEC repair packets than the last FEC repair packet should include the same number of repair symbols.

According to an embodiment, the transmitting device using the MMT FEC scheme should transfer, to the receiving device, information (hereinafter, 'FEC configuration information') needed to repair the source packet lost in the receiving device. The FEC configuration information may include the source FEC payload ID. The FEC configuration information may be included and transmitted in the FEC source packet and/or FEC repair packet according to its usage and characteristics. The FEC configuration information may also be transmitted via a separate packet for a signaling message which is neither the FEC source packet nor FEC repair packet.

Figure 10:
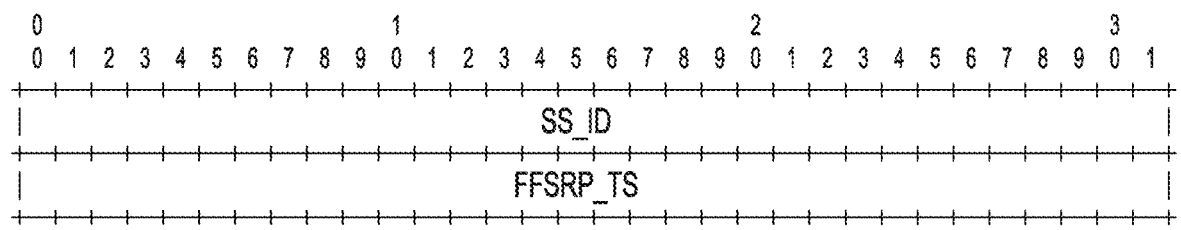
FIG. 10 is a view illustrating an example source FEC payload ID in a broadcast system according to an embodiment of the disclosure.

FIG. 10 is a view illustrating an example source FEC payload ID in a broadcast system according to an embodiment of the disclosure.

In FIG. 10, an example of usage of the SS_ID field and FFSRP_TS field is as follows.

SS_ID (32 bits)—denotes a sequence number for identifying the source symbols included in the relevant FEC source packet. After the maximum value, the sequence number goes back to 0.

When ssbg_mode 0 or ssbg_mode 1 is used, the SS_ID value is increased by one per FEC source packet. When ssbg_mode=10, the sequence number is increased by one per symbol element (including the symbol elements constituted only of padding), and the SS_ID value is set to the sequence number of the first symbol element included in the FEC source packet.

When the LA-FEC encoding structure is used, the lowest SS_ID of the source symbol block should be identical to SS_ID_max+1. Here, SS_ID_max is the highest SS_ID of the leading source symbol block of all the flows.

Figure 11:
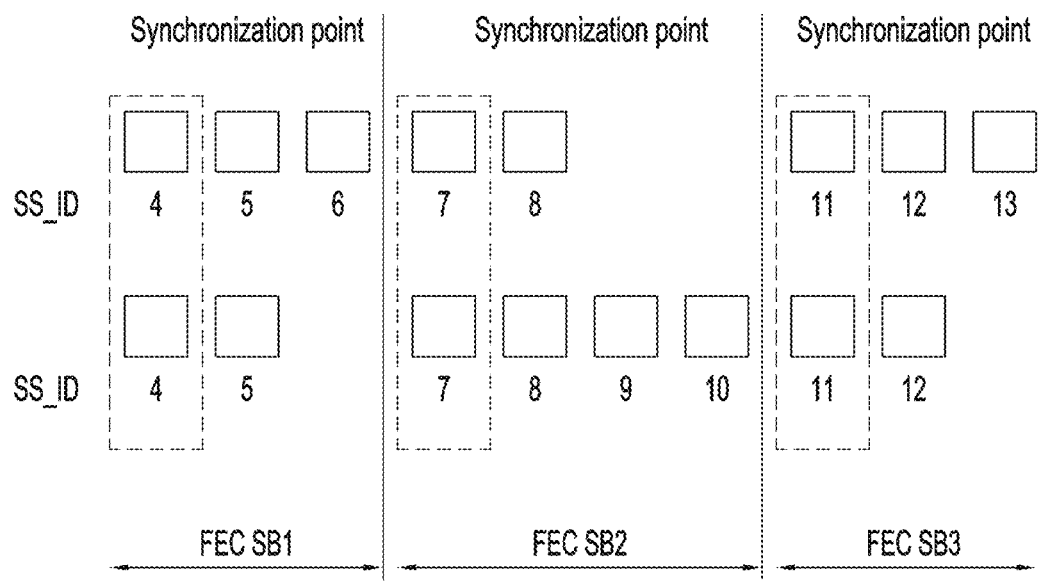
FIG. 11 is a view illustrating an example SS_ID configuration method when an LA_FEC encoding scheme is used in a broadcast system according to an embodiment of the disclosure.

FIG. 11 is a view illustrating an example SS_ID configuration method when an LA_FEC encoding scheme is used in a broadcast system according to an embodiment of the disclosure.

Referring to FIG. 11, the first SS_ID of the same source symbol block in each flow may be used as a synchronization point of all the source symbol blocks of all the flows.

FFSRP_TS(4 bytes)–FFSRP_TS consists of TS_Indicator(1 bit) and FP_TS(31 bits).

TS_Indicator(1 bit)—denotes the time stamp in FEC (refer to Table 1). For the one-stage FEC encoding structure and LA-FEC, the value of this field should be set to "0."

In the case of two-stage FEC encoding structure (M>1), if it is set to "1," this denotes that FP_TS (31 bits) is a value for the FEC source or repair packet block.

If set to "0," this denotes that the next FP_TS (31 bits) is a value for the ith FEC source or repair packet block (M>1 and i=1, 2, . . . M) of the two-stage FEC encoding structure.

In the case of the two-stage FEC encoding structure (M>1), for the odd-numbered FEC source packets of the ith FEC source packet block, this field is set to "0" and, for the even-numbered FEC source packets of the ith FEC source packet block, the field should be set "1." (i=1,2, . . . , M).

Table 1 below describes the TS_Indicator value.

TABLE 1

| value | description |
|---|---|
| b0 | The next FP-TS (31 bits) is for the FEC source or repair packet block of the one-stage FEC and LA-FEC encoding structure or the ith FEC source or repair packet block of the two-stage FEC encoding structure (M > 1 and i = 1, 2, . . . , M) |
| b1 | The next FP_TS (31 bits) is for the FEC source or repair packet block of the two-stage FEC encoding structure. |

FP_TS (31 bits)—FP_TS denotes the other 31 bits than the MSB in the 32-bit time stamp present in the packet header of the first MMTP packet transmitted in the relevant FEC source packet block/FEC repair packet block.

According to an embodiment, FFSRP_TS may selectively exist. The signaling message transferred via separate packets except for the FEC source/repair packet may include a flag indicating whether there is, e.g., FFSRP_TS.

The repair FEC payload ID of the FEC configuration information may be present after the MMTP packet header in the FEC repair packet as in the example of the FEC repair packet format shown in FIG. 9.

Figure 12:
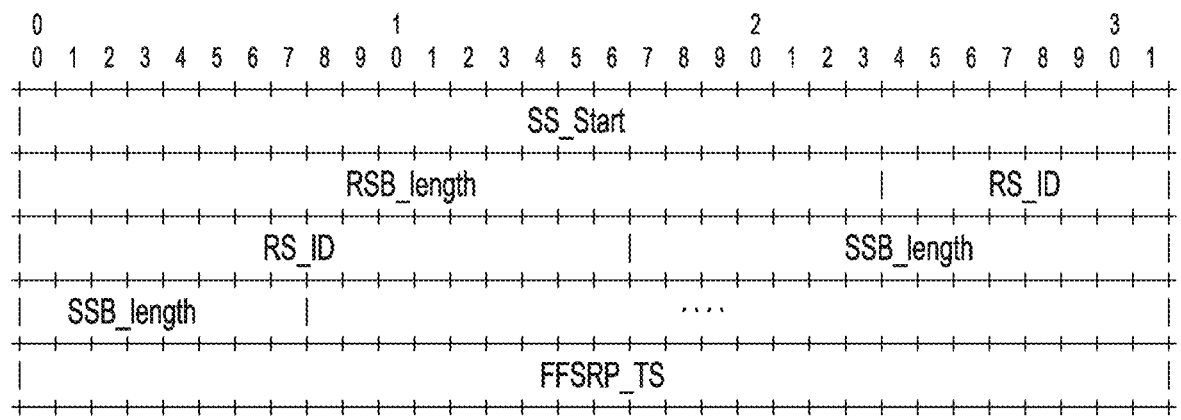
FIG. 12 is a view illustrating an example repair FEC payload ID in a broadcast system according to an embodiment of the disclosure.

FIG. 12 is a view illustrating an example repair FEC payload ID in a broadcast system according to an embodiment of the disclosure.

In FIG. 12, each field may be defined as follows.

SS_Start(32 bits)—denotes the border of the associated source symbol block. When ssbg_mode 0 or ssbg_mode 1 is used, it is set to the sequence number of the first source symbol of the associated source symbol block. When ssbg_mode 2 is used, it is set to the sequence number of the first symbol element of the associated source symbol block.

RSB_length(24 bits)—is the number of all the repair symbols of the repair symbol block including one or more repair symbols transmitted via the corresponding FEC repair packet.

RS_ID(24 bits)—is a sequence number for identifying the first repair symbol included in the corresponding FEC repair packet. When the FEC repair packet includes two or more repair symbols, the sequence number of one or more subsequent repair symbols to the first repair symbol is increased by one. This is why the sequence number is assigned as it starts with 9 and increases by 1 for the repair symbols included in each repair symbol block.

SSB_length[N](N*24 bits)—when the LA-FEC encoding structure is not used, N is "1," and SSB_length denotes the number of source symbols included in the associated source symbol block (when ssbg_mode 0 or ssbg_mode 1 is used) or the number of source symbol elements included in the associated source symbol block (when ssbg_mode 2 is used, the source symbol elements all of which are constituted of padding are excluded).

When the LA-FEC encoding structure is used, N should be identical to number of complementary layers+1, and SSB_length[i] denotes the number of source symbols included in the associated source symbol block of the ith flow (when ssbg_mode 0 or ssbg_mode 1 is used) or the number of symbol elements included in the associated source symbol block of the ith flow (when ssbg_mode 2 is used, the source symbol elements all of which are constituted of padding are excluded).

FFSRP_TS(4 bytes)—consists of TS_Indicator(1 bit) and its subsequent FP_TS(31 bits).

TS_Indicator(1 bit)—denotes the time stamp in FEC (refer to Table 2). For the one-stage FEC encoding structure and LA-FEC, the value of this field should be set to "0." In the case of the two-stage FEC encoding structure (M>1), the value of the field indicates the usage of FP_TS (31 bits). That is, if the value of the field is set to "1," this denotes that FP_TS (31 bits) is a value for the FEC source or repair packet block. If the value of the field is set to "0," this denotes that the next FP_TS (31 bits) is a value for the ith FEC source or repair packet block (M>1 and i=1, 2, . . . M) of the two-stage FEC encoding structure.

In the case of the two-stage FEC encoding structure (M>1), for the odd-numbered FEC source packets of the ith FEC source packet block, this field is set to "0" and, for the even-numbered FEC source packets of the ith FEC source packet block, the field may be set "1." (i=1, 2, . . . , M).

Table 2 below defines the TS_Indicator value.

TABLE 2

| value | description |
|---|---|
| b0 | The following FP-TS (31 bits) is for the FEC source or repair packet block of the one-stage FEC and LA-FEC encoding structure or the ith FEC source or repair packet block of the two-stage FEC encoding structure (M > 1 and i = 1, 2, . . . , M) |
| b1 | The following FP_TS (31 bits) is for the FEC source or repair packet block of the two-stage FEC encoding structure. |

FP_TS (31 bits)—denotes the other 31 bits than the MSB in the 32-bit time stamp present in the packet header of the first MMTP packet transmitted in the relevant FEC source packet block/relevant FEC repair packet block.

The AL-FEC message carries the configuration information of AL-FEC scheme to the receiver or network entity.

Table 3 to Table 5 show an example AL-FEC message format.

TABLE 3

| Syntax | Values | No. of bits | Mnemonic |
|---|---|---|---|
| AL FEC ( ){ | | | |
|   message_id | | 16 | |
|   version | | 8 | |
|   length | | 16 | |
|   message_payload{ | | | |
|     fec_flag | | 1 | bslbf |
|     private_fec_flag | | 1 | bslbf |
|     reserved | "111111" | 6 | bslbf |
|     if (fec_flag==1) { | | | |
|       length_of_fec_flow_descriptor | | 16 | uimsbf |
|       fec_flow_descriptor( ) { | | | |
|         number_of_fec_flows | N1 | 8 | uimbsf |
|         for ( i=0; i<N1 ; i++) { | | | |
|           fec_flow_id | | 8 | uimbsf |
|           source_flow_id | | 8 | uimbsf |
|           number_of_assets | N2 | 8 | uimbsf |
|           for ( j=0; j<N2 ;j++) { | | | |
|             packet_id | | 16 | uimbsf |
|           } | | | |
|           fec_coding_structure | | 4 | uimbsf |
|           ssbg_mode | | 2 | uimbsf |
|           ffsrpts_flag | | 1 | bslbf |
|           fec_payload_id_mode | | 1 | bslbf |
|           length_of_repair_symbol | | 16 | uimbsf |
|           if (ssbg_mode == 10) { | | | |
|             num_of_repair_symbol_per_packet | | 16 | uimbsf |
| | | 16 | uimbsf |
|           } | | | |
|           if (fec_coding_structure == 0001) { | | | |
|             repair_flow_id | | 16 | uimbsf |
|             fec_code_id_for_repair_flow | | 8 | uimbsf |
|             if (private_fec_flag == 1) { | | | |
|               private_flag | | 1 | bslbf |
|               private_field_length | N3 | 7 | bslbf |
|               private_field | | N3*8 | uimbsf |
|             } | | | |

TABLE 4

| | | | |
|---|---|---|---|
| maximum_k_for_repair_flow | | 24 | uimbsf |
| maximum_p_for_repair_flow | | 24 | uimbsf |
| protection_window_time | | 32 | uimbsf |
| protection_window_size | | 32 | uimbsf |
| } | | | |
| if (fec_coding_structure == 0010) { | | | |
|   num_of_sub_block_per_source_block | | 8 | uimbsf |
|   number_of_parity_flows | N4 | 8 | uimbsf |
|   for ( k=0; k<N4 ;k++){ | | | |
|     repair_flow_id | | 16 | uimbsf |
|     fec_code_id_for_repair_flow | | 8 | uimbsf |
|     if (private_fec_flag == 1) { | | | |
|       private_flag | | 1 | bslbf |
|       private_field_length | N5 | 7 | bslbf |
|       private_field | | N5*8 | uimbsf |
|     } | | | |
|     maximum_k_for_repair_flow | | 24 | uimbsf |
|     maximum_p_for_repair_flow | | 24 | uimbsf |
|     protection_window_time | | 32 | uimbsf |
|     protection_window_size | | 32 | uimbsf |
|   } | | | |
| } | | | |

TABLE 5

| | | | |
|---|---|---|---|
| if (fec_coding_structure == 0011) { | | | |
|   num_of_layer_for_LAFEC | N6 | 8 | uimbsf |
|   fec_code_id_for_repair_flow | | 8 | uimbsf |
|   if (private_fec_flag == 1) { | | | |
|     private_flag | | 1 | bslbf |
|     private_field_length | N7 | 7 | bslbf |
|     private_field | | N7*8 | uimbsf |
|   } | | | |

TABLE 5-continued

| | | | |
|---|---|---|---|
|   for ( l=0;l<N6 ;l++){ | | | |
|     repair_flow_id | | 16 | uimbsf |
|     maximum_k_for_repair_flow | | 24 | uimbsf |
|     maximum_p_for_repair_flow | | 24 | uimbsf |
|     protection_window_time | | 32 | uimbsf |
|     protection_window_size | | 32 | uimbsf |
|   } | | | |
| } | | | |
| } | | | |
| } | | | |
| } | | | |
| } | | | |

Table 3 to Table 5 describe the usage of each of the fields constituting the AL-FEC message.

message_id—an identifier for identifying the AL-FEC message.

version—version information for AL-FEC message.

length—the 16-bit field indicating the byte length of the AL-FEC message. Denotes the length from the next field to the last byte of the AL-FEC message, wherein 0 is not allowed.

fec_flag—denotes whether at least one source flow protected by AL-FEC exists. When none of the source flows are AL-FEC protected, the following message is not transferred.

Table 6 defines the value of the fec_flag field.

TABLE 6

| value | description |
| --- | --- |
| 0 | There is no FEC source flow |
| 1 | There is at least one FEC source flow. | private_fec_flag—denotes the presence of private FEC information. When the value is "0," this denotes that any FEC code identified with the subsequent fec_code_id_for_repair_flow field does not need private FEC information. When the value is "1," this denotes that the presence or absence of private FEC information and its length are provided using, at least, one byte (private_flag and private_field_length) for all the FEC codes identified with the subsequent fec_code_id_for_repair_flow field.

length_of_fec_flow_descriptor—byte length of fec_flow_descriptor number_of_fec_flows—number of FEC-encoded packet flows (FEC encoded flows)

fec_flow_id—an integer for identifying the FEC-encoded packet flow. Each FEC-encoded packet flow has one associated FEC source flow and one or more FEC repair flows.

source_flow_id—an integer for identifying the FEC source flow. Each FEC source flow has one associated FEC-encoded packet flow.

number_of_assets—number of assets included in the corresponding FEC source flow.

packet_id—packet_id field value of MMTP packet header.

ssbg_mode—SSBG mode value.

Table 7 defines valid values of ssbg_mode field.

TABLE 7

| value | Meaning |
| --- | --- |
| b00 | ssbg_mode0 (with constant MMTP packet size) |
| b01 | ssbg_mode1 (with variable MMTP packet size) |
| b10 | ssbg_mode2 (with variable MMTP packet size) |
| b11 | Reserved | ffsrpts_flag—denotes whether FFSRP_TS(32 bits) exists in all source FEC payload IDs and repair FEC payload IDs.

Table 8 defines valid values of ffsrpts_flag field.

TABLE 8

| value | description |
| --- | --- |
| b0 | None of source FEC payload IDs and repair FEC payload IDs include FFSRP_TS (32 bits). |
| b1 | All source FEC payload IDs and repair FEC payload IDs include FFSRP_TS (32 bits). | fec_payload_id_mode—FEC payload ID mode as applied.

Table 9 defines valid values of fec_payload_id_mode field.

TABLE 9

| value | description |
| --- | --- |
| b0 | FEC payload ID mode 0 |
| b1 | FEC payload ID mode 1 | length_of_repair_symbol—byte length of repair symbol.

Number of repair symbols transmitted with one FEC repair packet when num_of_repair_symbol_per_packet—ssbg_mode 2 is used.

Number of symbol elements constituting one source symbol when num_of_symbol_element_per_source_symbol—ssbg_mode 2 is used.

fec_coding_structure—FEC encoding structure applied to associated FEC source flow.

Table 10 defines allowed values of fec_coding_structure field.

TABLE 10

| value | description |
| --- | --- |
| b0000 | AL-FEC does not apply |
| b0001 | One-stage FEC encoding structure |
| b0010 | Two-stage FEC encoding structure |
| b0011 | Layer-aware FEC encoding structure |
| b0100 to b1111 | Reserved | num_of_sub_block_per_source_block—number of split-into source packet blocks constituting one source packet block in two-stage encoding structure.

number_of_repair_flows—number of FEC repair flows.

num_of_layer_for_LAFEC—number of layers of media protected in layer-aware FEC encoding structure.

repair_flow_id—integer for identifying repair FEC flow. Denotes the packet_id value of the MMTP packet header of the FEC repair packet. The packet_id value of the FEC repair flow is repair_flow_id.

fec_code_id_for_repair_flow—identifier of FEC code applied to associated FEC repair flow.

private_flag—when this is set to "1," it denotes that there exists a private field for transferring private FEC information for a specific FEC algorithm. When it is set to "0," this denotes that there is no private field.

Table 11 defines allowed values of private_flag field.

TABLE 11

| value | description |
| --- | --- |
| b0 | There is no private field for specific FEC algorithm |
| b1 | There is private field for specific FEC algorithm | private_field_length—byte length of private field. When private_flag="0," the value should beset to "0" to indicate that there is no private_field.

private_field—includes private FEC information for a specific FEC algorithm.

maximum_k_for_repair_flow—maximum allowed number of source symbols constituting one source symbol block.

maximum_p_for_repair_flow—maximum allowed number of repair symbols constituting one repair symbol block.

FEC protection window means the number of packets or time when all of the packets belonging to the related FEC source packet block/FEC repair packet block should be transmitted. Thus, the difference between the time stamp of the last packet transmitted among the packets belonging to the related source packet block/repair packet block and the time stamp of the first packet transmitted should not exceed the FEC protection window.

protection_window_time—denotes the maximum time difference between the first packet display among the packets belonging to the related FEC source packet block/FEC repair packet block and the last packet transmitted in unit of $1/1000$ second (millisecond). When the value of this field is "0," "protection_window_size" is used.

protection_window_size—denotes the maximum packet count between the first packet display among the packets belonging to the related FEC source packet block/FEC repair packet block and the last packet transmitted. When the value of this field is "0," "protection_window_time" is used.

As described above, the FEC scheme may be operated in two different modes. The two modes may be FEC payload ID mode 0 and FEC payload ID mode 1. FEC payload ID mode 0 adds the source FEC payload ID to the MMTP packet, and FEC payload ID mode 1 is a mode that makes no change to the MMTP packet.

The encoding symbol of FEC payload ID mode 1 is the same as that in FEC payload ID mode 0. That is, the source packets (MMT packets) belonging to the source packet block are arranged in the same order as packet_id provided for the FEC-encoded packet flow of the AL-FEC message. When the same packet_id applies, they are arranged in ascending order of packet_sequence_number.

The source symbol block of FEC payload ID mode 1 is the same as the source symbol block when ssbg_mode 0 and ssbg_mode 1 are used.

Figure 13:
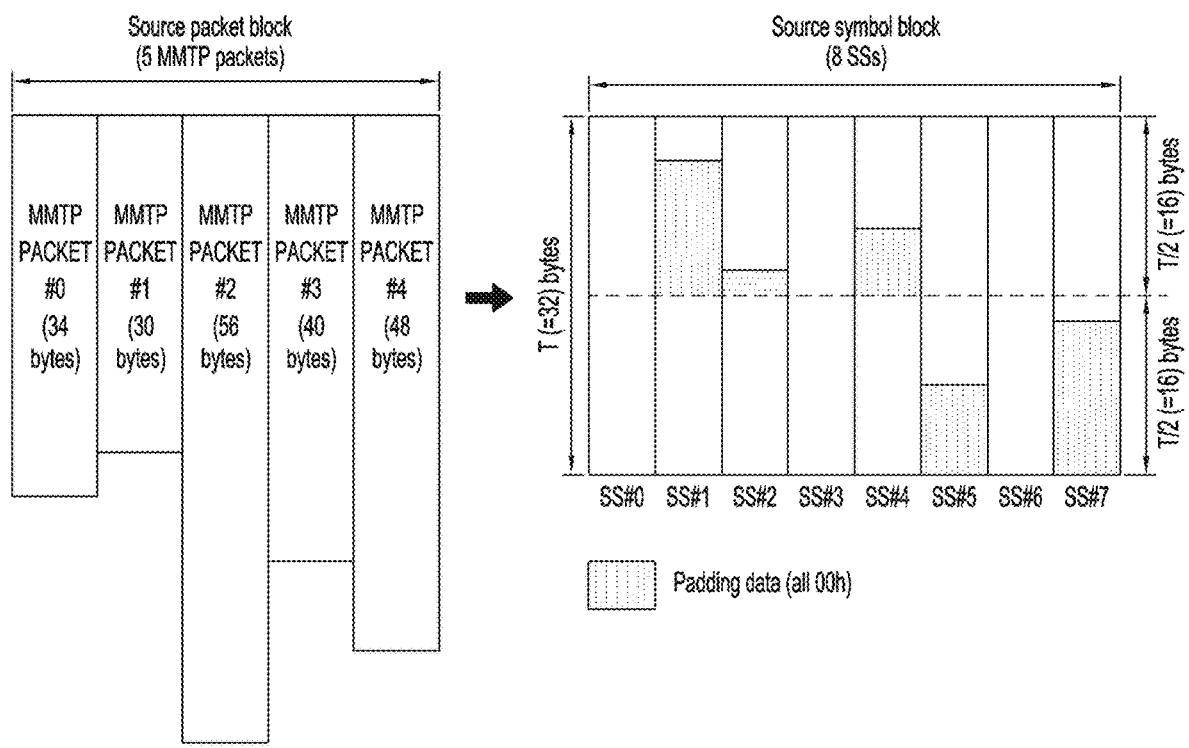
FIG. 13 is a view illustrating an example of generating a source symbol block in a source packet block using ssbg_mode 2 in a communication system according to an embodiment of the disclosure.

FIG. 13 is a view illustrating an example of generating a source symbol block in a source packet block using ssbg_mode 2 in a communication system according to an embodiment of the disclosure.

Referring to FIG. 13, it is assumed that one source packet block consists of, e.g., five MMTP packets, and the five MMTP packets are individually 34, 30, 56, 40, and 48. The five MMTP packets may be arranged in the source symbol block constituted of eight source symbols. The size T of each of the eight source symbols would be 32. Each of the eight source symbols may consist of two symbol elements (T'=T/2=16 bytes).

According to the above assumption, one MMTP packet may be disposed at one or multiple source symbols. For example, MMTP packet #0 having a size of 34 bytes would first be arranged at two symbol elements constituting one source symbol (SS #0) having a size of 32 bytes. The remaining two bytes in MMTP packet #0 are arranged at the first symbol element of the two symbol elements constituting the next source symbol (SS #1). The remaining two bytes of MMTP packet #0 are arranged at the first symbol element, and the remaining bytes may be filled with padding data. The remaining four MMTP packets may be arranged at the remaining source symbols using the same rule.

In FEC payload ID mode 1, the FEC source packet lacks source FEC payload ID and thus has the same format as the existing MMTP packet.

Figure 14:
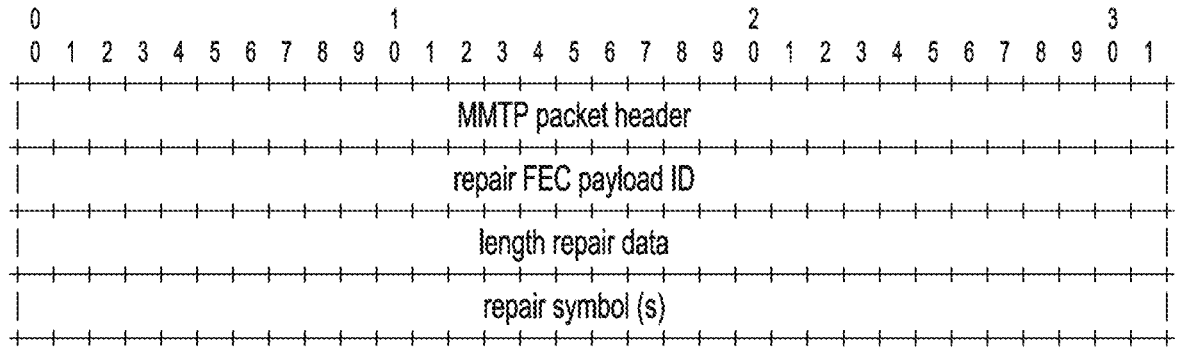
FIG. 14 is a view illustrating another example FEC repair packet format in a broadcast system according to an embodiment of the disclosure.

FIG. 14 is a view illustrating another example FEC repair packet format in a broadcast system according to an embodiment of the disclosure.

Referring to FIG. 14, an FEC repair packet may include an MMTP packet header, a repair FEC payload ID, length repair data, and one or more repair symbols. The length repair data may be selectively present, and its presence or absence may be known through the repair FEC payload ID. The length repair data is information for protecting the length symbol constituted of two octets, and each length symbol denotes the length of each packet belonging to the associated source packet block and the length of dropped packet.

Further, when ssbg_mode 0 or ssbg_mode 1 is used, the FEC repair packet should include only one repair symbol. When ssbg_mode 2 is used, the FEC repair packet may include one or more repair symbols.

Further, among the FEC repair packets belonging to the FEC repair packet block, all the other FEC repair packets than the last FEC repair packet should include the same number of repair symbols.

Figure 15:
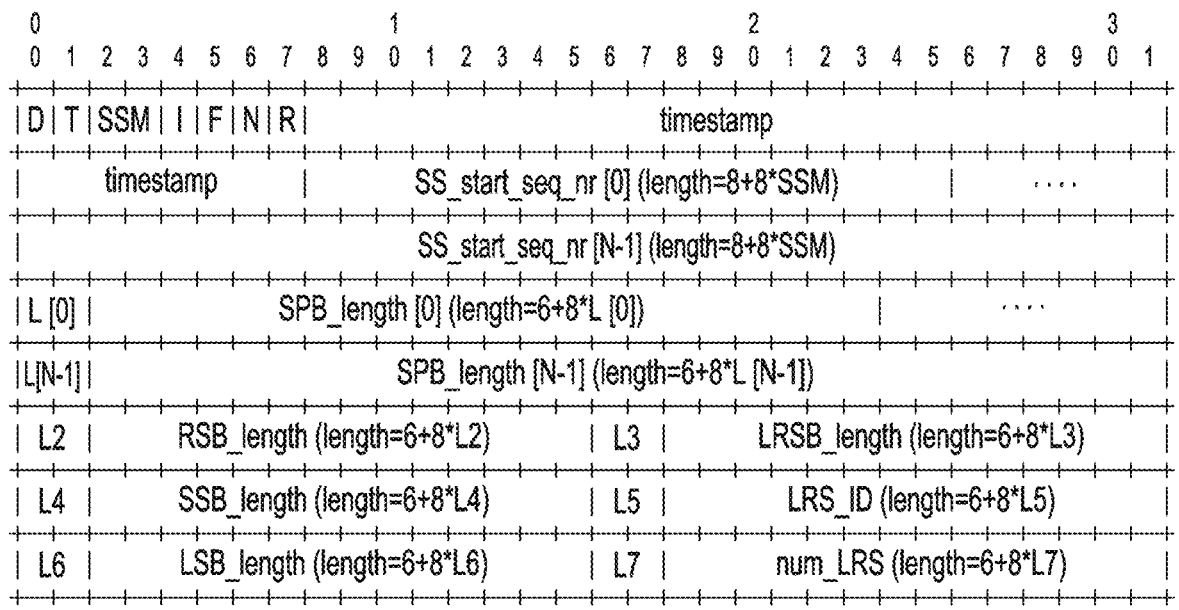
FIG. 15 is a view illustrating an example repair FEC payload ID in a broadcast system according to an embodiment of the disclosure.

FIG. 15 is a view illustrating an example repair FEC payload ID in a broadcast system according to an embodiment of the disclosure.

Referring to FIG. 15, among the fields included in the repair FEC payload ID, the field providing information per asset (packet_id), SS_start_seq_nr[i], L[i], and SPB_length[i] follow the order of packet_id provided via the AL-FEC message. Further, this order is the same as the order in which the source symbols are arranged in the source symbol block.

An example of usage of each field shown in FIG. 15 is as follows.

Discontinuity_flag(D, 1 bits)—denotes that there is discontinuity in the packet_sequence_number field present in the MMTP packet header of the FEC source packet generated by the source packets having the same packet_id included in the source packet block protected by the FEC repair packet.

When the corresponding value is set to, e.g., "0," there should be no discontinuity in the packet_sequence_number field values of the source packets having the same packet_id included in the source packet block.

When the value is, e.g., "1," the value of the I field present thereafter should be set to "1."

T(1 bit)—denotes whether the timestamp field exists. When the value is, e.g., "0," no timestamp field exists and, when the value is, e.g., "1," a timestamp field exists.

SSM(2 bits)—denotes the length of SS_start_seq_nr[i] fields present thereafter. The length of the SS_start_seq_nr[i] field is "8+8*SSM bit".

I(1 bit)—denotes the presence or absence of length repair data. When the value is set to, e.g., "1," the length repair data should exist and, when the value is set to, e.g., "0," the length repair data should not exist. When the value of the D field is "1" or SSBG Mode 2 is used, the value should be set to "1."

FEC_parameter_flag(F, 1 bits)—denotes whether the length repair data has been generated using the same parameter and the same FEC code as the repair symbol of FEC repair packet. When the value is, e.g., "0," L3, LRSB_length, L6, LSB_length field do not exist. When the value is, e.g., "1," L3, LRSB_length, L6, LSB_length field exists. The field should be set to "0" when the value of I field is "0" and, when the value of the D field is "1," it should be set to "1.".

num_LRS_flag(N, 1 bits)—denotes whether the number of length repair symbols included in the length repair data of the current FEC repair packet is the same as the number of repair symbols included in the current FEC repair packet.

When the value is set to, e.g., "0," the length repair data should include the same number of repair symbols as the number of repair symbols included in the current FEC repair packet, and there should not be L5, LRS_ID, L7 and num_LRS fields.

When the value is set to, e.g., "1," the length repair data may include a different number of repair symbols from the number of repair symbols included in the current FEC repair packet, and there should be L5, LRS_ID, L7 and num_LRS fields.

The field should be set to "0" when the value of I field is "0" and, when the value of the F field is "1," it should be set to "1.".

reserved(R: 1 bit)—bit reserved for future use.

timestamp(32 bits)—denotes the timestamp field value present in the packet header of the MMTP packet first transmitted in the related FEC source/repair packet block.

SS_start_seq_nr[i](8+8*SSM bits)—denotes the lower 8+8*SSM bits of the minimum value of packet_sequence_number of the packets where the packet_id value in the source packet block protected with the FEC repair packet is the same as the ith packet_id value provided in the AL-FEC message (encoded FEC flow loop). i is 0, 1, . . . , N−1, and N is the number of assets belonging to the encoded FEC flow.

L[i](2 bits)—denotes the length of SPB_length[i] field positioned subsequent. The length of SPB_length[i] field is, e.g., "6+8*L[i]".

SPB_length[i](6+8*L[i] bits)—denotes (SS_end_seq_nr [i]−SS_start_seq_nr[i]+1) value. Here, SS_end_seq_nr[i] denotes the lower 8+8*SSM bits of the maximum value of packet_sequence_number of the packets where the packet_id value in the source packet block protected with the FEC repair packet is the same as the ith packet_id value provided in the AL-FEC message (encoded FEC flow loop).

When the value of the D field is, e.g., "0," the value of the field denotes the number of the packets where the packet_id value in the source packet block protected with the FEC repair packet is the same as the ith packet_id value provided in the AL-FEC message (encoded FEC flow loop).

L2(2 bits)—denotes the length of the RSB_length field located after. The length of the RSB_length field is, e.g., "6+8*L2" bits.

RSB_length(6+8*L2 bits)—denotes the number of repair symbols constituting the related repair symbol block.

L3(2 bits)—denotes the length of the LRSB_length field located after. The length of the LRSB_length field is, e.g., "6+8*L3" bits. The field exists only when the value of the F field is, e.g., "1."

LRSB_length(6+8*L3 bits)—denotes the number of repair symbols constituting the associated length repair symbol block. The field exists only when the value of the F field is, e.g., "1." When this field does not exist although the value of the I field is "1," this denotes that the number of length repair symbols constituting the repair symbol block is the same as the number of repair symbols constituting the repair symbol block associated with the FEC repair packet.

L4(2 bits)—denotes the length of the SSB_length field located after. The length of the SSB_length field is, e.g., "6+8*L4" bits. This field exists only when SSBG Mode 2 is used.

SSB_length(6+8*L4 bits)—denotes the number of source symbols constituting the associated source symbol block. This field exists only when SSBG Mode 2 is used.

L5(2 bits)—denotes the length of the LRS_ID field located after. The length of the LRS_ID field is, e.g., "6+8*L5" bits. The field exists only when the value of the N field is, e.g., "1."

LRS_ID(6+8*L5 bits)—denotes an integer for identifying the first length repair symbol included in the FEC repair packet. This starts from a value, e.g., 0, given in the length repair symbol block, and increases by one per repair symbol. The field exists only when the value of the N field is, e.g., "1." When this field does not exist although the value of the I field, this denotes that the value of the field is the same as the value of the RS_ID field.

L6(2 bits)—denotes the length of the LSB_length field located after. The length of the LSB_length field is, e.g., "6+8*L6" bits. The field exists only when the value of the F field is "1."

LSB_length(6+8*L6 bits)—denotes the number of length symbols constituting the associated length symbol block. The field exists only when the value of the F field is, e.g., "1." When this field does not exist although the value of the I field is "1," this denotes that the number of length symbols constituting the length symbol block is the same as the number of source symbols constituting the source symbol block associated with the FEC repair packet.

L7(2 bits)—denotes the length of the num_LRS field located after. The length of the num_LRS field is, e.g., "6+8*L7" bits. The field exists only when the value of the N field is, e.g., "1."

num_LRS(6+8*L7 bits)—denotes the number of length repair symbols constituting the length repair data of the FEC repair packet. The field exists only when the value of the N field is, e.g., "1." When the field does not exist although the value of the I field is "1," this denotes that the value of the field is identical to the number of repair symbols included in the current FEC repair packet.

RS_ID(24 bits)—is a sequence number for identifying the first repair symbol included in the corresponding FEC repair packet. When the FEC repair packet includes two or more repair symbols, the sequence number of the repair symbols subsequent to the first repair symbol increases by a given value, e.g., 1. For all the repair symbol blocks, it starts with a given value, e.g., 0, and increases by a given value, e.g., 1, per repair symbol. The field is transmitted in lower 24 bits of the packet_sequence_number field of the MMTP packet header.

The above-described FEC payload ID mode 1 is for the FEC operation that does not use the source FEC payload ID and transfers, to the receiving device, where each MMT packet (source packet) is positioned in the source symbol block, using the repair FEC payload ID.

When the above-described SSBG Mode 2 is used, the position of the source packet in the source symbol block may depend on the lengths of other source packets previous to the source packet. The packet_sequence_number field value of the MMT packets (source packets) having the same packet_id belonging to the source packet block may have a discontinuity due to dropped packets. In this case, additional length repair data is required to reconfigure the source symbol block using the FEC source packet received by the receiving device.

To that end, the transmitting device may generate the length repair symbol block constituted of one or more length repair symbols protecting the length symbol block. The length symbol block may consist of length symbols, and each length symbol may have a constant size of two bytes. The constant value denotes the length of the MMTP packet belonging to the "virtual source packet block."

Let's say that among the packet_sequence_number's of the MMT packets having the same packet_id belonging to the source packet block, the minimum value is Smin (packet_id) and the maximum value is Smax (packet_id). At this time, the "virtual source packet block" includes the MMT packet included in the associated source packet block and the dropped MMT packet which has the packet_id protected with the source packet block and where the packet_sequence_number value is in the range of {Smin(packet_id)+1, Smin(packet_id)+2 . . . Smax(packet_id)−1}. The dropped packet is not transmitted on an actual channel nor is it protected by FEC. The value of the length symbol associated with the dropped packet may be set to a preset value (e.g., 0).

In the above-described embodiment, the length repair symbol is generated through the same FEC code as the associated FEC repair flow. According to an implementation, the length repair symbol may also be generated using an FEC code different from the FEC code. However, in this case, the other FEC code used should be provided to the receiving device. The value of the remaining length symbol when the number of length symbols constituting the length symbol block is larger than the number of MMT packets belonging to the "virtual source packet block" may be set to a predetermined value (e.g., 0).

Meanwhile, cases where num_LRS_flag field denotes whether the number of length repair symbols included in the length repair data of the current FEC repair packet is the same as the number of repair symbols included in the current FEC repair packet have been described above.

However, it should be noted that the num_LRS_flag field may be used not only in the above form but in the following form as well.

num_LRS_flag(N, 1 bits)—denotes whether the number of length repair symbols included in the length repair data of the current FEC repair packet has the same sequence number as repair symbols included in the current FEC repair packet.

When the value is set to, e.g., "0," the length repair data should include the same number of repair symbols as the number of repair symbols included in the current FEC repair packet. The sequence number of each length repair symbol should be the same as the sequence number of the repair symbol in the same order. Further, the L5, LRS_ID, L7, and num_LRS fields should be absent.

When the value is set to, e.g., "1," the L5, LRS_ID, L7 and num_LRS fields should necessarily exist. This denotes that the number of length repair symbols included in the length repair data of the current FEC repair packet and the sequence number of each length repair symbol are signaled via the fields.

The field should be set to "0" when the value of I field is "0" and, when the value of the F field is "1," it should be set to "1.". Further, for the FEC repair packets belonging to one FEC repair packet block, the value of the field should be set to be identical.

This is described below again.

num_LRS_flag(N, 1 bits)—denotes whether the identifier values of the length repair symbols included in the length repair data of the FEC repair packet are the same as the identifier values of the repair symbols transferred by the corresponding FEC repair packet.

As an example, when the number of length repair symbols included in the length repair data is the same as the number of repair symbols included in the FEC repair packet, the value of the num_LRS_flag field may be set to "0." In this case, the identifier of each length repair symbol may have the same value in the same order as the identifier of the repair symbol. In this case, the repair FEC payload ID may lack the L5 field, LRS_ID field, L7 field, and num_LRS field.

As another example, when the repair FEC payload ID has the L5 field, LRS_ID field, L7 field, and num_LRS field, the value of the num_LRS_flag field may be set to "1." In this case, the number of length repair symbols and the identifier value of the first length repair symbol included in the length repair data of the FEC repair packet may be explicitly provided.

Further, when the value of the I field is set to, e.g., "0," the value of the num_LRS_flag field may be set to "0." When the value of the F field is set to, e.g., "1," the value of the num_LRS_flag field may be set to "1." The value of the num_LRS_flag field would be the same for all the FEC repair packets included in the FEC repair packet block.

According to an embodiment, in the receiving device, the FEC decoder may repair the MMT packet length information using the length repair data, reconstruct the related source symbol block using the repaired length information, and perform FEC decoding, restoring the source symbol. When the length of the repaired MMT packet is 0, it may be regarded as a dropped packet.

It is hypothesized that a source symbol block including K source symbols is generated from a source packet block including K' MMT packets (source packets) using the SSBG Mode and the source symbol block is protected by a repair symbol block including P repair symbols. At this time, the repair symbol may be generated using the same parameter as the parameter used to protect the source symbol block. This means that a length source symbol is configured of K length symbols and that a length repair symbol block is configured of P length repair symbols. At this time, the value of the first K' length symbols may be set to the MMT packet length of the relevant source packet block, and the value of the remaining K-K' length symbols may be set to 0.

Of course, the position of each field included in the repair FEC payload ID shown in FIG. 15 may be changed.

Figures 16, 17:
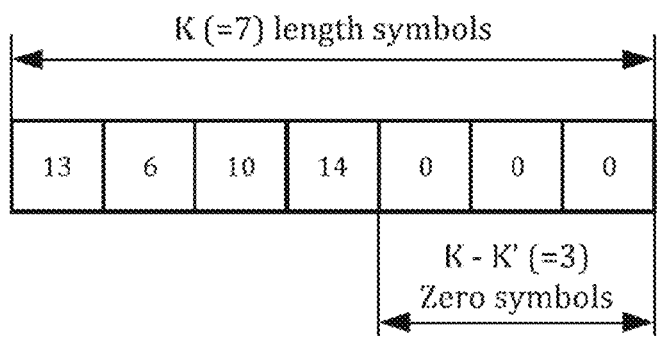
FIG. 16 is a view illustrating a source symbol block generated using ssbg_mode 2 in a broadcast system according to an embodiment of the disclosure.
FIG. 17 is a view illustrating an example length symbol block for packet length information protection in a broadcast system according to an embodiment of the disclosure.

FIG. 16 is a view illustrating an example source symbol block generated using ssbg_mode 2 in a broadcast system according to an embodiment of the disclosure. FIG. 17 is a view illustrating an example length symbol block for protecting packet length information in a broadcast system according to an embodiment of the disclosure.

According to an embodiment, the transmitting device generates P length repair symbols and transmits the length repair symbols as length repair data of an FEC repair packet. In this case, the length repair symbol and the repair symbol having the same identification value may be included and transmitted in the same packet. In the above-described embodiment of repair FEC payload ID, the LRS_ID may be omitted.

It is hypothesized that in a virtual source packet block configured of K' MMP packets, p MMT packets are not transmitted, and a source packet block configured of K'-p MMT packets is used. At this time, the packet_sequence_number field value of the MMT packets having the same packet_id belonging to the source packet block may have a discontinuity due to dropped packets.

Figure 18:
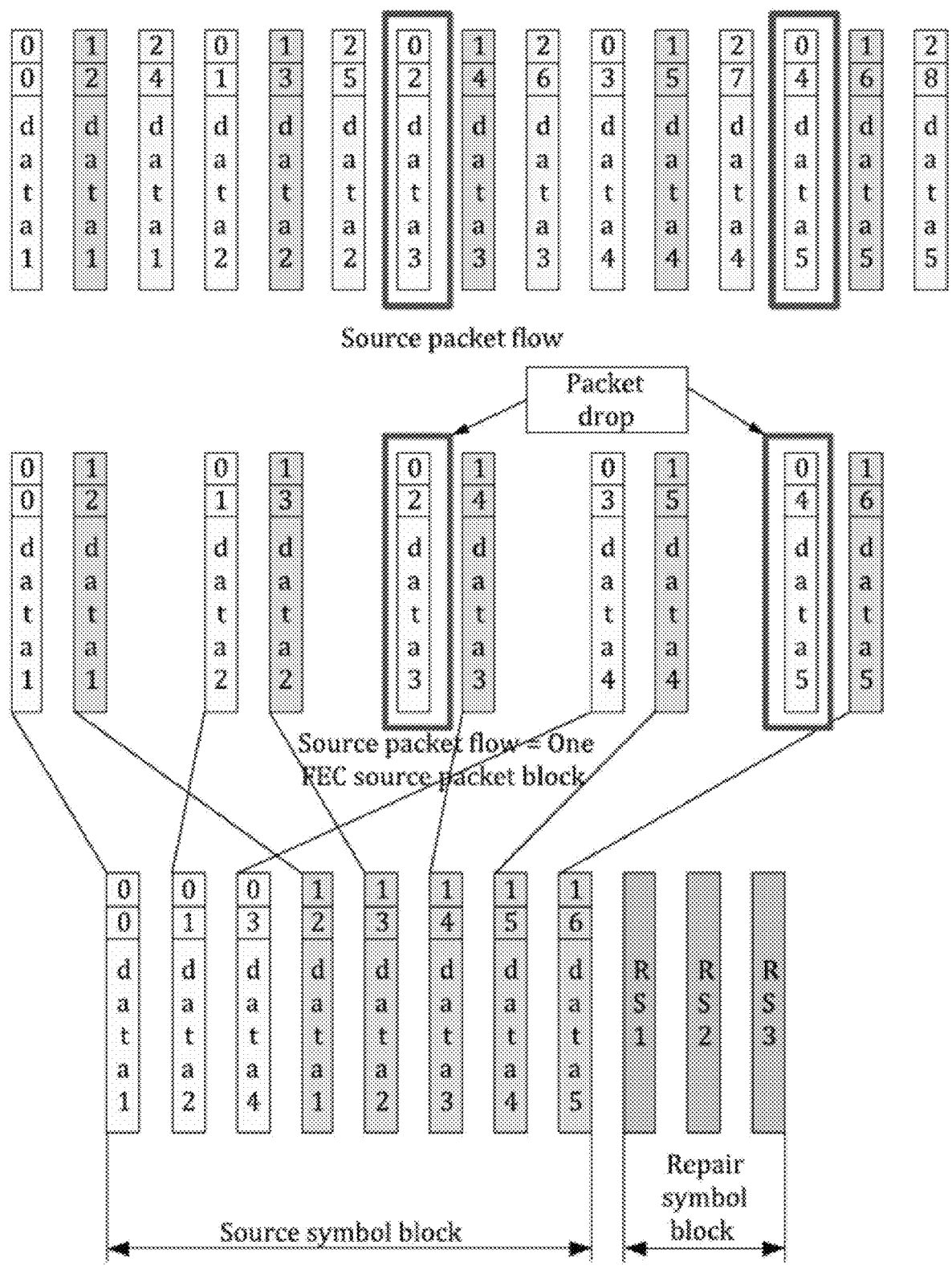
FIG. 18 is a view illustrating an example encoding symbol block when a packet drop is applied in a broadcast system according to an embodiment of the disclosure.

FIG. 18 is a view illustrating an example encoding symbol block when a packet drop is applied in a broadcast system according to an embodiment of the disclosure.

Referring to FIG. 18, it may be identified that two MMT packets in a virtual source packet block including 10 MMT packets are not transmitted and, thus, the source packet block includes only eight MMT packets.

Figure 19:
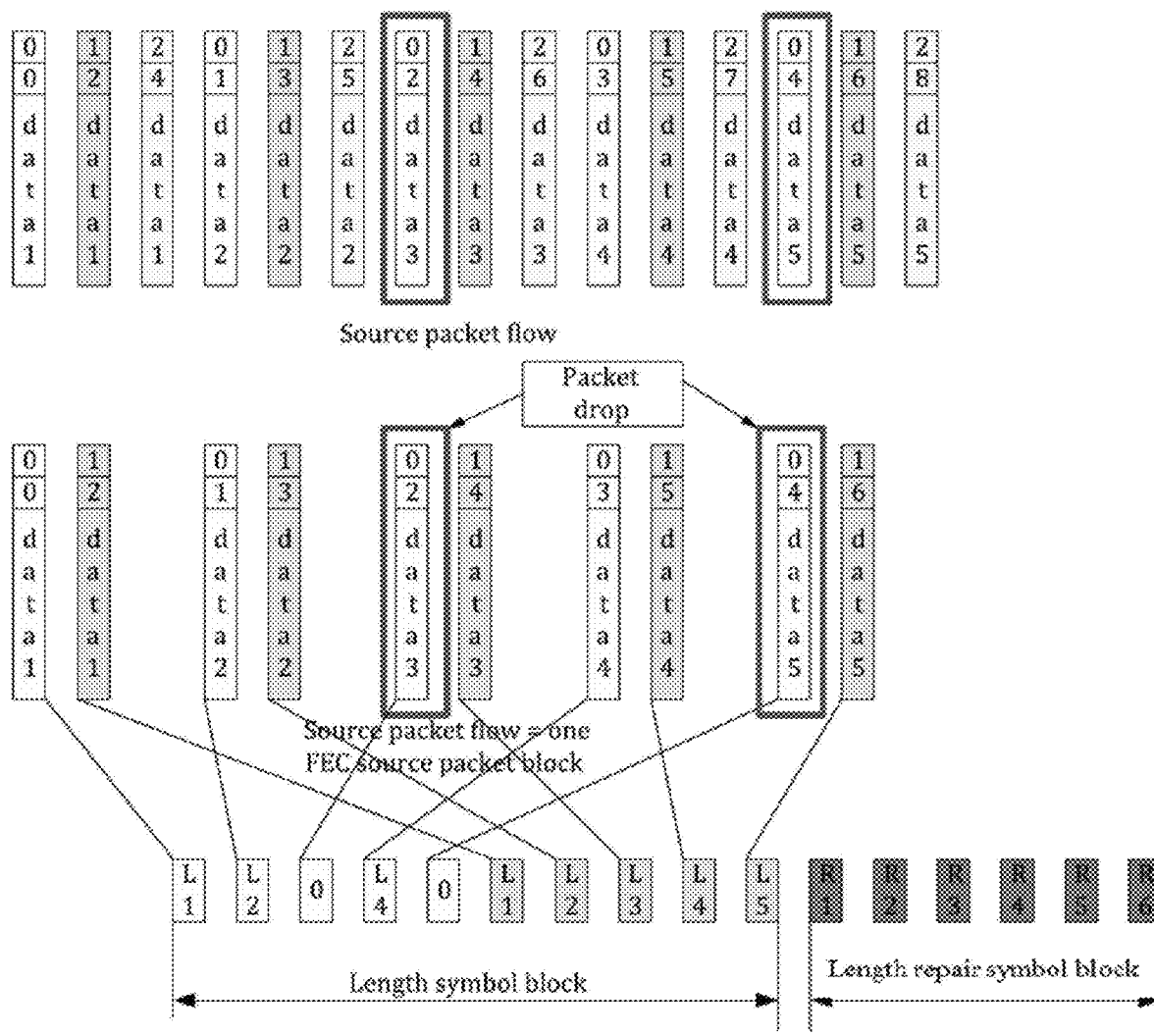
FIG. 19 is a view illustrating an example length encoding symbol block when a packet drop is applied in a broadcast system according to an embodiment of the disclosure.

FIG. 19 is a view illustrating an example length encoding symbol block when a packet drop is applied in a broadcast system according to an embodiment of the disclosure.

Referring to FIG. 19, it may be identified that since the virtual source packet block includes 10 MMT packets, the length symbol block is also comprised of 10 length symbols.

Figure 20:
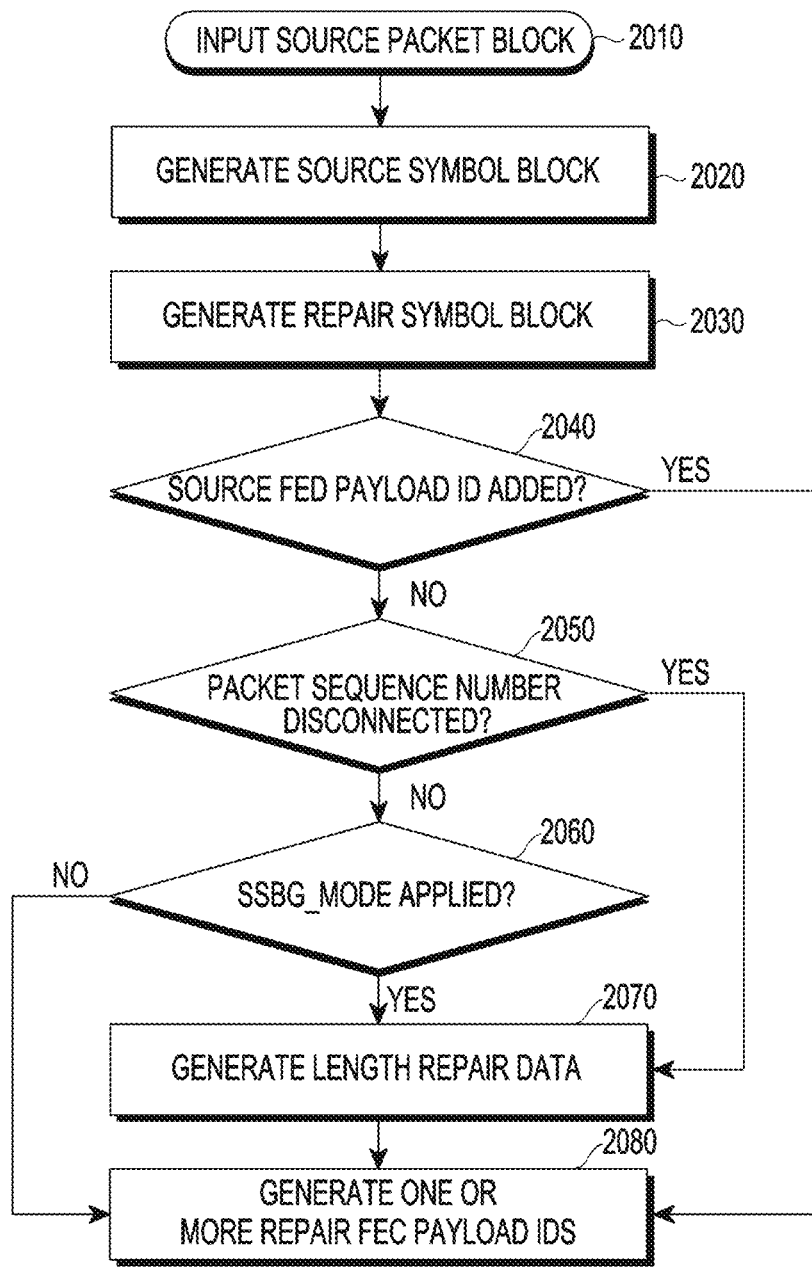
FIG. 20 is a view illustrating an operation procedure of a transmitting device in a broadcast system according to an embodiment of the disclosure.

FIG. 20 is a view schematically illustrating an operation procedure of a transmitting device in a broadcast system according to an embodiment of the disclosure Referring to FIG. 20, the transmitting device inputs a source packet block in step 2010. In step 2020, the transmitting device generates one or more source symbol blocks using the input source packet block. In step 2030, the transmitting device performs FEC encoding on the generated source symbol blocks, generating one or more repair symbol blocks.

In step 2040, the transmitting device determines whether to need to include the source FEC payload ID in the FEC source packet.

When the source FEC payload ID is needed to be included in the FEC source packet, the transmitting device generates one or more source FEC payload IDs in step 2080.

Unless the source FEC payload ID is needed to be included in the FEC source packet, the transmitting device checks whether the value of the packet sequence number discontinuity indicator (discontinuity in packet_sequence_number) field needs to be set to 1 in operation 2050.

The packet transmitted by the transmitting device may include the sequence number corresponding to the relevant packet. The receiving device may re-sort the packets received with the sequence numbers. At this time, when there is a discontinuity in the sequence numbers, i.e., unless the packet with a specific sequence number is received, the receiving device needs to identify the cause of the failure in reception of the packet. That is, the receiving device needs to be able to identify whether the packet reception failure results from a loss during transmission or a transmission drop by the transmitting device.

The value of the packet sequence number discontinuity indicator field may indicate, e.g., whether the packet sequence discontinuity results from a packet drop. In this case, the transmitting device may determine that the value of the packet sequence number discontinuity indicator field is supposed to be set to '1.'

Unless the value of the packet sequence number discontinuity indicator field needs to be set to 1, the transmitting device checks whether SSBG Mode 2 needs to be applied in step 2060.

When SSBG Mode 2 needs to be applied, or the value of the packet sequence number discontinuity indicator field needs to be set to 1, the transmitting device generates length repair data in step 2070.

When the length repair data is generated or the source FEC payload ID needs to be included in the FEC source packet, the transmitting device generates one or more source FEC payload IDs in step 2080.

Of course, various modifications may be made to the above-described embodiments of operations of the transmitting device in the communication signal. As an example, the steps described above in connection with FIG. 20 may overlap or occur in parallel or in a different order or multiple times.

As set forth above, it should be noted that the information that may be required for the determinations in steps 2040, 2050, and 2060 may be given as a result of the computations in steps 2010, 2020, and 2030 or be determined based on transmission policies per service of the transmitting device or per FEC-encoded packet flow.

Meanwhile, it should be noted that, although not shown in FIG. 20, the transmitting device may include the process of generating the repair FEC payload ID.

Figure 21:
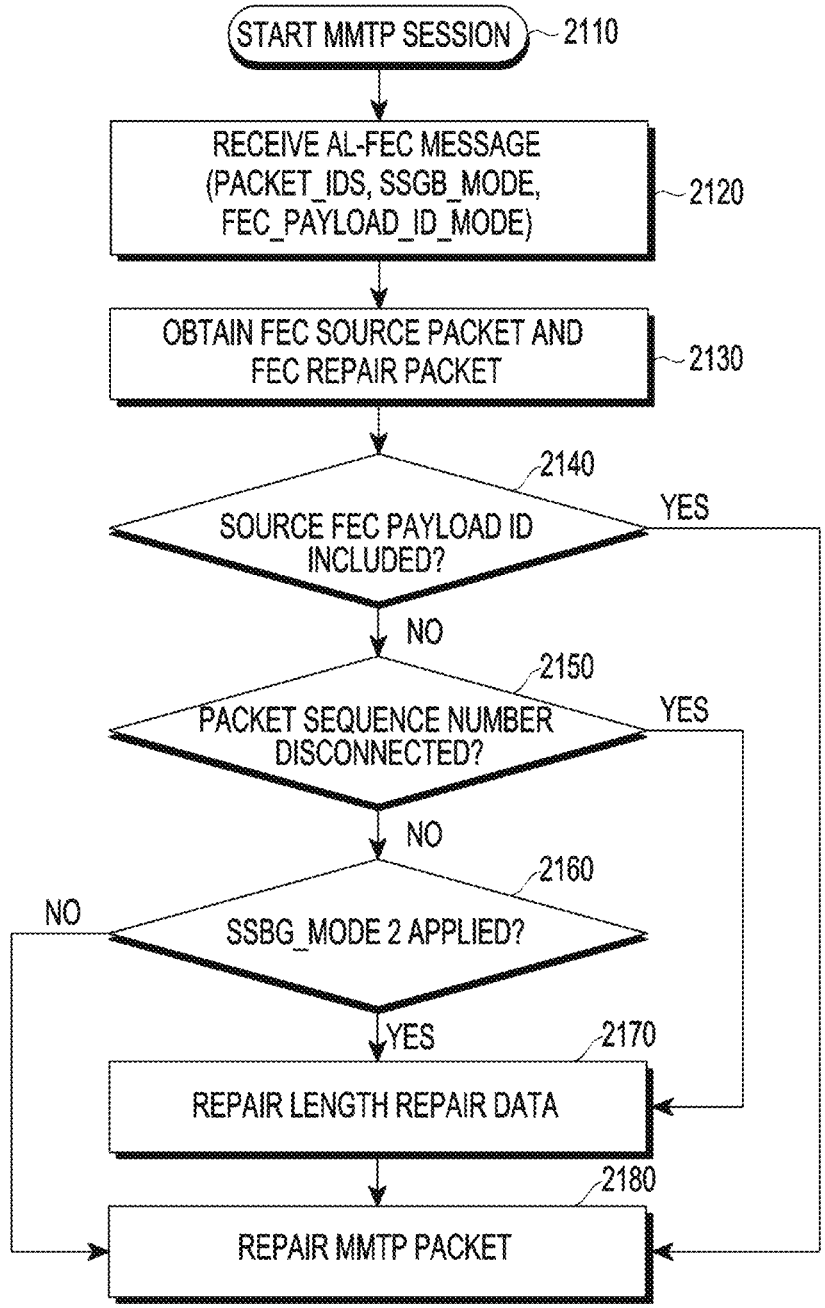
FIG. 21 is a view illustrating an operation procedure of a receiving device in a broadcast system according to an embodiment of the disclosure.

FIG. 21 is a view schematically illustrating an operation procedure of a receiving device in a broadcast system according to an embodiment of the disclosure.

Referring to FIG. 21, the receiving device detects a start of an MMTP session in step 2210 and, in step 2120, receives an AL-FEC message from the transmitting device. The AL-FEC message may include packet_ids, ssgb_mode, fec_payload_id_mode. Described above in detail, the AM-FEC message is not described below in further detail.

In step 2130, the receiving device may obtain the FEC source packet and FEC repair packet based on the received AL-FEC message. The receiving device checks whether the obtained FEC repair packet includes the source FEC payload ID in step 2140. When the result of checks reveals that the source FEC payload ID exists, the receiving device performs AL-FEC decoding to repair the missing MMT packet in step 2180.

Unless the source FEC payload ID exists, the receiving device may, in step 2150, check whether the value of the Discontinuity in packet_sequence_number field is set to 1 from the repair FEC payload ID of the FEC repair packet. When the result of checking shows that the value of the Discontinuity in packet_sequence_number field is set to 1, the receiving device may, in step 2170, perform AL-FEC decoding, restoring the length repair data. In step 2180, the receiving device repairs missing MMT packets by performing AL-FEC decoding.

Unless the value of the Discontinuity in packet_sequence_number field is set to 1, the receiving device checks whether SSBG Mode 2 has been applied in step 2160. If SSBG Mode 2 has not been applied, the receiving device, in step 2180, repairs missing MMT packets by performing AL-FEC decoding.

If SSBG Mode 2 has been applied, the receiving device, in step 2170, repairs the length repair data by performing AL-FEC decoding in step 2170 and, in step 2180, performs AL-FEC decoding to thereby repair missing MMT packets.

Although FIG. 21 illustrates the operation procedure by the receiving device in the broadcast system according to an embodiment of the disclosure, various modifications may be made to FIG. 21. As an example, although the continuous steps are shown in FIG. 21, the steps of FIG. 21 may overlap or arise in parallel or in different order, or several number of times.

In the above-described embodiment of Repair FEC payload ID, the receiver is directly signaled whether there is a discontinuity in the packet_sequence_number of the MMT packets with the same packet_id using the D field. Rather than directly signaling the discontinuity in the packet_sequence_number, the receiving device may repair the length of the packets using the length repair data and then determine that a specific value (e.g., 0) indicates a failure in transmission of packets.

Figure 22:
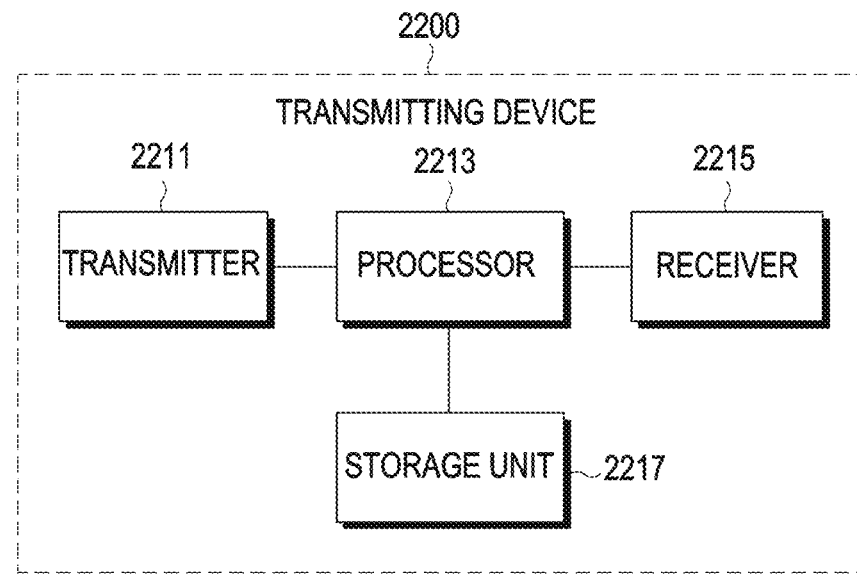
FIG. 22 is a view schematically illustrating an internal structure of a transmitting device in a broadcast system according to an embodiment of the disclosure.

FIG. 22 is a view schematically illustrating an internal structure of a transmitting device in a broadcast system according to an embodiment of the disclosure.

Referring to FIG. 22, the transmitting device 2200 includes a transmitter 2211, a processor 2213, a receiver 2215, and a storage unit 2217.

First, the processor 2213 controls the overall operation of the transmitting device 2200, in particular, operations related to transmission/reception of signals in a broadcast system. Operations related to transmission/reception of signals in a broadcast system are the same as those described above in connection with FIGS. 1 to 21, and no detailed description thereof is given below.

The transmitter 2211 transmits various signals and various messages to other devices included in a broadcast system under the control of the processor 2213. Various signals and messages transmitted by the transmitter 2211 are the same as those described above in connection with FIGS. 1 to 21, and no detailed description thereof is repeated.

The receiver 2215 receives various signals and various messages from other devices included in a broadcast system under the control of the processor 2213. Various signals and messages received by the receiver 2215 are the same as those described above in connection with FIGS. 1 to 21, and no detailed description thereof is repeated.

The storage unit 2217 stores a program and various data related to signal transmission/reception performed by the transmitting device 2200 under the control of the processor 2213.

The storage unit 2217 stores various signals and messages received by the receiver 2215 from other devices.

FIG. 22 illustrates an example in which the transmitting device 2200 is implemented with separate units, such as the transmitter 2211, the processor 2213, the receiver 2215, and the storage unit 2217. However, the transmitting device 2200 may be implemented as a combination of at least two of the transmitter 2211, the processor 2213, the receiver 2215, and the storage unit 2217.

Further, the processor 2213 of the transmitting device 2200 may be implemented as at least one processor.

Figure 23:
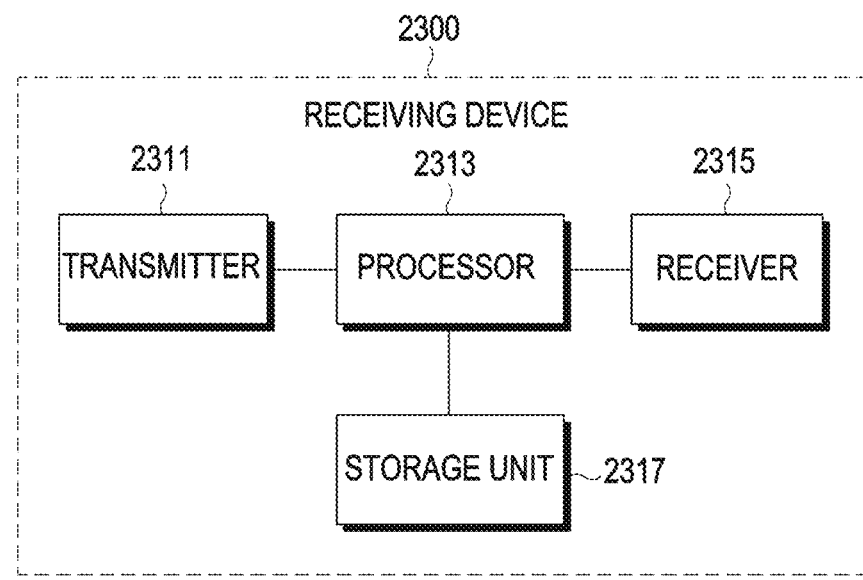
FIG. 23 is a view schematically illustrating an internal structure of a receiving device in a broadcast system according to an embodiment of the disclosure.

FIG. 23 is a view schematically illustrating an internal structure of a receiving device in a broadcast system according to an embodiment of the disclosure.

Referring to FIG. 23, the receiving device 2300 includes a transmitter 2311, a processor 2313, a receiver 2315, and a storage unit 2317.

The processor 2313 controls the overall operation of the receiving device 2300, in particular, operations related to transmission/reception of signals in a broadcast system. Operations related to transmission/reception of signals in a broadcast system are the same as those described above in connection with FIGS. 1 to 21, and no detailed description thereof is given below.

The transmitter 2311 transmits various signals and various messages to other devices included in a broadcast system under the control of the processor 2313. Various signals and messages transmitted by the transmitter 2311 are the same as those described above in connection with FIGS. 1 to 21, and no detailed description thereof is repeated.

The receiver 2315 receives various signals and various messages from other devices included in a broadcast system under the control of the processor 2313. Various signals and messages received by the receiver 2315 are the same as those described above in connection with FIGS. 1 to 21, and no detailed description thereof is repeated.

The storage unit 2317 stores a program and various data related to signal transmission/reception performed by the receiving device 2300 under the control of the processor 2313. The storage unit 2317 stores various signals and messages received by the receiver 2315 from other devices.

FIG. 23 illustrates an example in which the receiving device 2300 is implemented with separate units, such as the transmitter 2311, the processor 2313, the receiver 2315, and the storage unit 2317. However, the receiving device 2300 may be implemented as a combination of at least two of the transmitter 2311, the processor 2313, the receiver 2315, and the storage unit 2317.

Further, the processor 2313 of the receiving device 2300 may be implemented as at least one processor.

Particular aspects of the present invention may be implemented in computer-readable codes on a computer-readable recording medium. The computer readable recording medium is a data storage device that may store data readable by a computer system. Examples of the computer readable recording medium may include read only memories (ROMs), random access memories (RAMs), compact disk-read only memories (CD-ROMs), magnetic tapes, floppy disks, optical data storage devices, and carrier waves (such as data transmission over the Internet). The computer readable recording medium may be distributed by computer systems over a network, and accordingly, the computer readable codes may be stored and executed in a distributed manner. Functional programs, codes, and code segments to attain the present invention may be readily interpreted by skilled programmers in the art to which the present invention pertains.

The apparatuses and methods according to embodiments of the present invention may be implemented in hardware, software, or a combination of hardware and software. Such software may be stored in a volatile or non-volatile storage device such as a read-only memory (ROM) or other storage devices, a memory, such as a random access memory (RAM), a memory chip, a device or an integrated circuit, or a storage medium, such as, e.g., a compact disc (CD), a digital video disc (DVD), a magnetic disk, or a magnetic tape, which allows for optical or magnetic recording while simultaneously read out by a machine (e.g., a computer). The methods according to embodiments of the present invention may be implemented by a computer or a portable terminal including at least one processor and a memory, and the memory may be an exemplary machine-readable storage medium that may properly retain program(s) containing instructions for implementing the embodiments of the present invention.

Accordingly, the present disclosure encompasses a program containing codes for implementing the device or method set forth in the claims of this disclosure and a machine (e.g., computer)-readable storage medium storing the program. The program may be electronically transferred via any media such as communication signals transmitted through a wired or wireless connection and the present disclosure properly includes the equivalents thereof.

The apparatuses according to embodiments of the present invention may receive the program from a program providing device wiredly or wirelessly connected thereto and store the same. The program providing apparatus may include a memory for storing a program including instructions enabling a program processing apparatus to perform a preset content protection method and information necessary for the content protection method, a communication unit for performing wired or wireless communications with a graphic processing apparatus, and at least one processor transmitting the program to the transmitting/receiving device automatically or as requested by the graphic processing apparatus.

Although specific embodiments of the present disclosure have been described above, various changes may be made thereto without departing from the scope of the present disclosure. Thus, the scope of the present invention should not be limited to the above-described embodiments, and should rather be defined by the following claims and equivalents thereof.

The invention claimed is:

1. A method of generating a transmission packet by a transmitting device in a broadcast system, the method comprising:
   generating a source symbol block having plurality of source symbols using a source packet block having a plurality of source packets by one generation mode of a plurality of generation modes;
   generating a repair symbol block for the generated source symbol block by one forward error correction (FEC) scheme of a plurality of forward FEC schemes;
   generating a repair packet based on the generated repair symbol blocky; and
   transmitting the repair packet,
   wherein the repair packet includes repair FEC payload identifier (ID), and
   wherein the repair FEC payload ID includes:
      a first flag indicating whether a discontinuity of packet sequence number for the plurality of source packets is present, and
      a second flag indicating whether length repair data is present.

2. The method of claim 1, wherein the repair FEC payload ID further includes a third flag indicating whether a same FEC code is used to generate the length repair data and generate the repair symbol block.

3. The method of claim 2, wherein the repair FEC payload ID further includes a fourth flag indicating whether a number of repair symbols included in the length repair data is the same as the number of repair symbols included in the repair packet.

4. The method of claim 3, wherein the repair FEC payload ID further includes information about a length configured based on the first flag, the second flag, the third flag, and the fourth flag.

5. A transmitting device of a broadcast system, comprising:
- a transmitter configured to transmit a transmission packet; and
- at least one processor connected with the transmitter, wherein the at least one processor is configured to:
  - generate a source symbol block having plurality of source symbols using a source packet block having a plurality of source packets by one generation mode of a plurality of generation modes,
  - generate a repair symbol block for the generated source symbol block by one forward error correction (FEC) scheme of a plurality of forward FEC schemes,
  - generate a repair packet based on the generated repair symbol block, and
  - transmit the repair packet,
- wherein the repair packet includes a repair FEC payload identifier (ID), and
- wherein the repair FEC payload ID includes:
  - a first flag indicating whether a discontinuity of packet sequence number for the plurality of source packets is present, and
  - a second flag indicating whether length repair data is present.

6. The transmitting device of claim 5, wherein the repair FEC payload ID further includes a third flag indicating whether a same FEC code is used to generate the length repair data and generate the repair symbol block.

7. The transmitting device of claim 6, wherein the repair FEC payload ID further includes a fourth flag indicating whether a number of repair symbols included in the length repair data is the same as the number of repair symbols included in the repair packet.

8. The transmitting device of claim 7, wherein the repair FEC payload ID further includes information about a length configured based on the first flag, the second flag, the third flag, and the fourth flag.

9. A method of restoring a transmission packet by a receiving device in a broadcast system, the method comprising:
- receiving a repair packet generated based on a repair symbol block; and
- restoring at least one source packet using the repair packet,
- wherein the repair packet includes a repair FEC payload identifier (ID), and
- wherein the repair FEC payload ID includes:
  - a first flag indicating whether a discontinuity of packet sequence number for a plurality of source packets is present, and
  - a second flag indicating whether length repair data is present.

10. The method of claim 9, further comprising
wherein the repair FEC payload ID further includes information about a length configured based on the first flag, the second flag, a third flag, and a fourth flag.

11. A receiving device of a broadcast system, comprising:
a receiver configured to receive a repair packet generated based on a repair symbol block; and
at least one processor connected with the receiver,
wherein the at least one processor is configured to:
repair at least one source packet using the repair packet,
wherein the repair packet includes a repair FEC payload identifier (ID), and
wherein the repair FEC payload ID includes:
- a first flag indicating whether a discontinuity of packet sequence number for a plurality of source packets is present, and
- a second flag indicating whether length repair data is present.

12. The receiving device of claim 11, wherein
the repair FEC payload ID further includes information about a length configured based on the first flag, the second flag, a third flag, and a fourth flags.

* * * * *